US012593739B2

(12) United States Patent
Yeo et al.

(10) Patent No.: US 12,593,739 B2
(45) Date of Patent: Mar. 31, 2026

(54) POWER MODULE

(71) Applicant: AMOSENSE CO., LTD, Cheonan-si (KR)

(72) Inventors: Intae Yeo, Cheonan-si (KR); Taeho Cho, Cheonan-si (KR); Jinhyuck Bin, Cheonan-si (KR); Seunggon Park, Cheonan-si (KR); Wonsan Na, Cheonan-si (KR); Taejung Kim, Cheonan-si (KR); Jihyung Lee, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 538 days.

(21) Appl. No.: 18/014,723

(22) PCT Filed: Jul. 1, 2021

(86) PCT No.: PCT/KR2021/008324
§ 371 (c)(1),
(2) Date: Jan. 5, 2023

(87) PCT Pub. No.: WO2022/010174
PCT Pub. Date: Jan. 13, 2022

(65) Prior Publication Data
US 2023/0275010 A1 Aug. 31, 2023

(30) Foreign Application Priority Data

Jul. 6, 2020 (KR) ........................ 10-2020-0082529
Jul. 17, 2020 (KR) ........................ 10-2020-0088754
(Continued)

(51) Int. Cl.
*H05K 1/14* (2006.01)
*H10W 40/25* (2026.01)
(Continued)

(52) U.S. Cl.
CPC ......... *H10W 90/701* (2026.01); *H10W 70/05* (2026.01); *H10W 90/00* (2026.01); *H10W 90/401* (2026.01); *H10W 40/255* (2026.01)

(58) Field of Classification Search
CPC ............. H01L 23/49833; H01L 25/072; H01L 23/3735; H05K 1/144; H05K 3/368; H10W 40/255; H01K 1/144
See application file for complete search history.

(56) References Cited

U.S. PATENT DOCUMENTS 8,884,343 B2 * 11/2014 Lange ..................... H01L 24/24
438/106
9,331,009 B2 5/2016 Choi et al.
(Continued)

FOREIGN PATENT DOCUMENTS

EP 3 474 643 A1 4/2019
JP 2010251548 A * 11/2010
(Continued)

OTHER PUBLICATIONS

KR Office Action dated Sep. 20, 2024 in application 1020200092878.
(Continued)

*Primary Examiner* — Michele Fan
(74) *Attorney, Agent, or Firm* — Maschoff Brennan

(57) ABSTRACT

The present invention relates to a power module comprising: a lower ceramic substrate (200); an upper ceramic substrate (300) which is disposed above the lower ceramic substrate (200) and has a semiconductor chip (G) mounted on the lower surface thereof; a PCB substrate (400) disposed above the upper ceramic substrate (300); and a connection pin (800) which extends through through holes (320 and 420) formed in the upper ceramic substrate (300) and the PCB substrate (400), and vertically connects electrode patterns (a, b, c, and d) formed on the upper ceramic substrate (300) and the PCB substrate (400). The present invention provides a
(Continued)

shortened electrical connection distance between the upper ceramic substrate and the PCB substrate, and thus can minimize a current path and enhance the moving efficiency of a high-speed current.

17 Claims, 11 Drawing Sheets

(30) Foreign Application Priority Data

| | | |
|---|---|---|
| Jul. 17, 2020 | (KR) ........................ | 10-2020-0088755 |
| Jul. 27, 2020 | (KR) ........................ | 10-2020-0092878 |

(51) Int. Cl.
*H10W 70/05* (2026.01)
*H10W 90/00* (2026.01)

(56) References Cited

U.S. PATENT DOCUMENTS

| | | | |
|---|---|---|---|
| 9,922,911 | B1 | 3/2018 | Park et al. |
| 10,211,068 | B2 | 2/2019 | Oi et al. |
| 11,291,113 | B2 | 3/2022 | Lee et al. |
| 2012/0127684 | A1 | 5/2012 | Matsumoto et al. |
| 2013/0075932 | A1 | 3/2013 | Schwarzer et al. |
| 2014/0217571 | A1* | 8/2014 | Ganesan ........... H01L 23/49811 |
| | | | 257/693 |
| 2015/0289392 | A1 | 10/2015 | Yoo et al. |
| 2015/0296620 | A1 | 10/2015 | Lee et al. |
| 2015/0380374 | A1* | 12/2015 | Nakamura .............. H01L 24/01 |
| | | | 361/783 |
| 2016/0021737 | A1 | 1/2016 | Oh et al. |
| 2016/0027711 | A1* | 1/2016 | Harada ............. H01L 23/49827 |
| | | | 257/698 |
| 2017/0064808 | A1 | 3/2017 | Rizza et al. |
| 2017/0118858 | A1 | 4/2017 | Cheng |
| 2019/0148163 | A1 | 5/2019 | Sato et al. |

FOREIGN PATENT DOCUMENTS

| | | | |
|---|---|---|---|
| JP | 2011-077224 A | 4/2011 |
| KR | 10-2015-0116605 A | 10/2015 |
| KR | 10-2015-0117459 A | 10/2015 |
| KR | 10-2015-0127999 A | 11/2015 |
| KR | 10-2016-0010246 A | 1/2016 |
| KR | 10-2016-0097584 A | 8/2016 |
| KR | 10-2017-0068271 A | 6/2017 |
| KR | 10-2017-0072037 A | 6/2017 |
| KR | 10-2017-0073618 A | 6/2017 |
| KR | 10-2018-0030298 A | 3/2018 |
| KR | 10-2018-0052143 A | 5/2018 |
| WO | 2017222235 A1 | 12/2017 |

OTHER PUBLICATIONS

EPO Decision to Grant dated Nov. 13, 2024 in application 21838130.9.

Extended European Search Report dated Nov. 20, 2023 as received in Application No. 21838130.9.

KR Office Action dated Sep. 9, 2024 as received in Application No. 10-2020-0082529.

KR Office Action dated Sep. 9, 2024 as received in Application No. 10-2020-0088754.

KR Office Action dated Sep. 23, 2024 as received in Application No. 10-2020-0088755.

* cited by examiner

[FIG. 1]
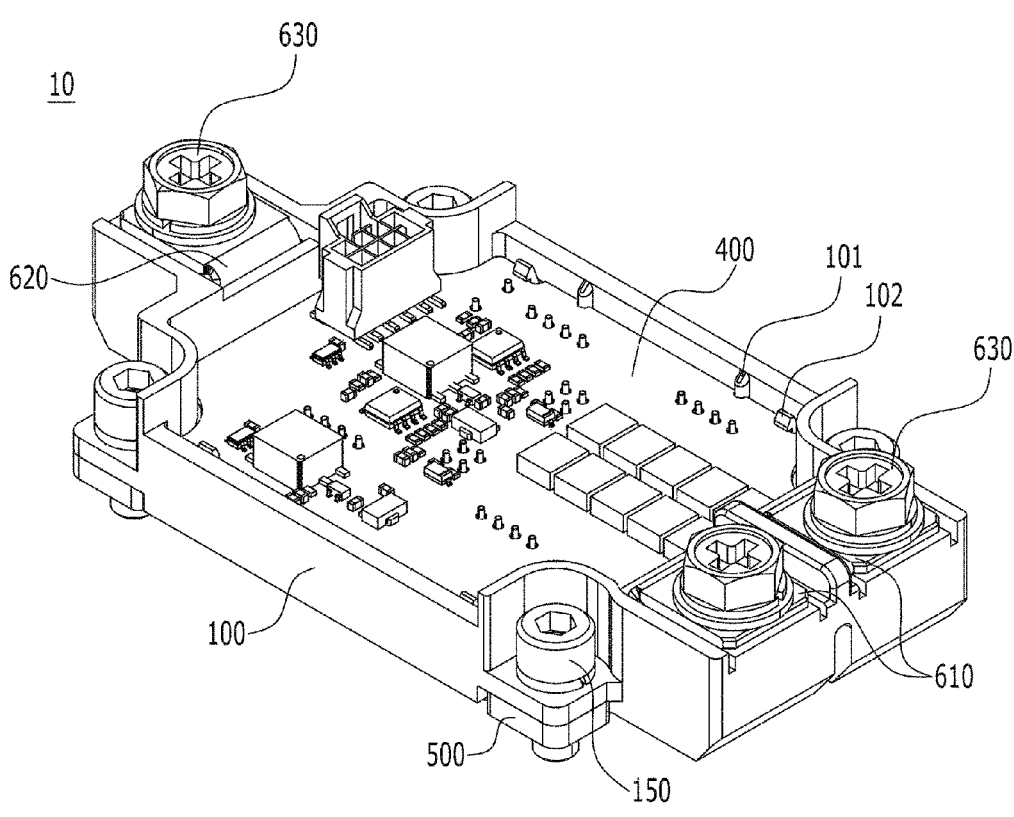

【FIG. 2】
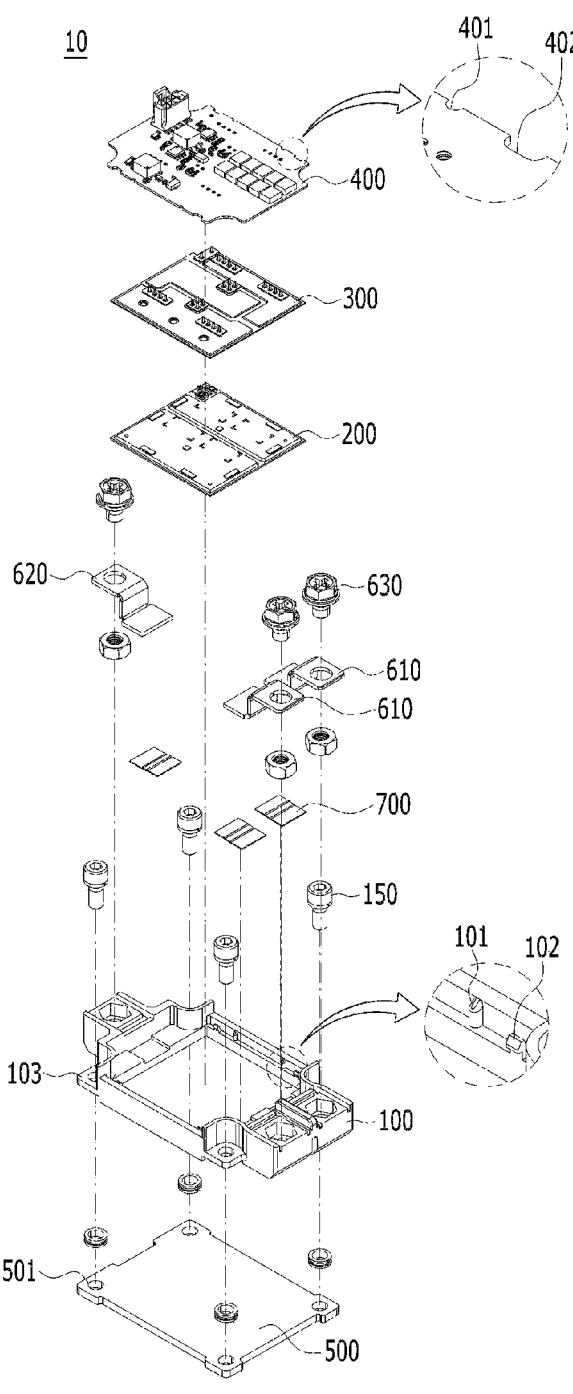

【FIG. 3】
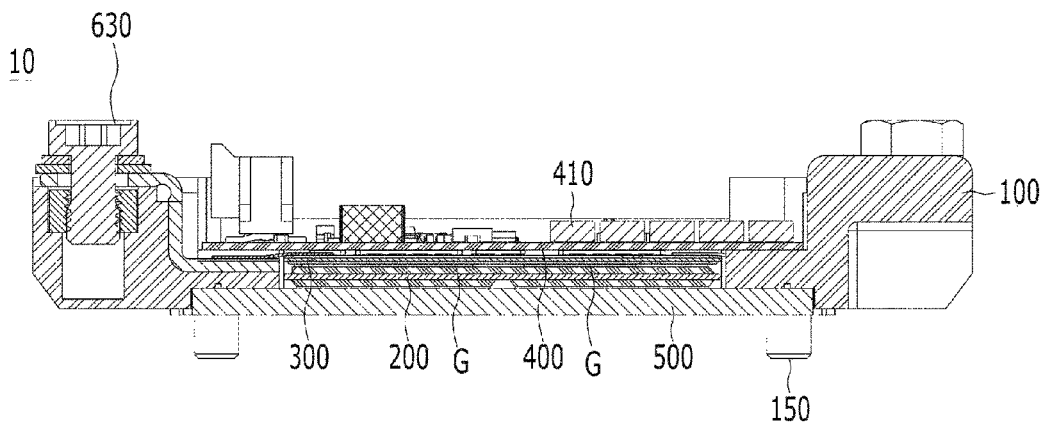
【FIG. 4】
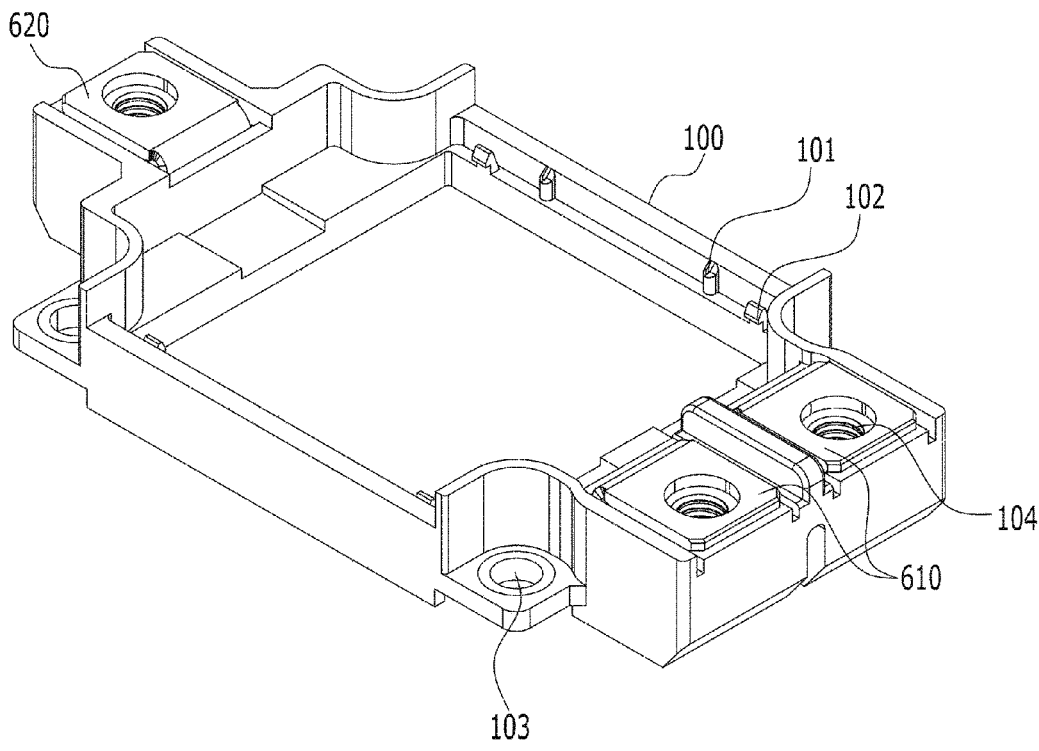

【FIG. 5】
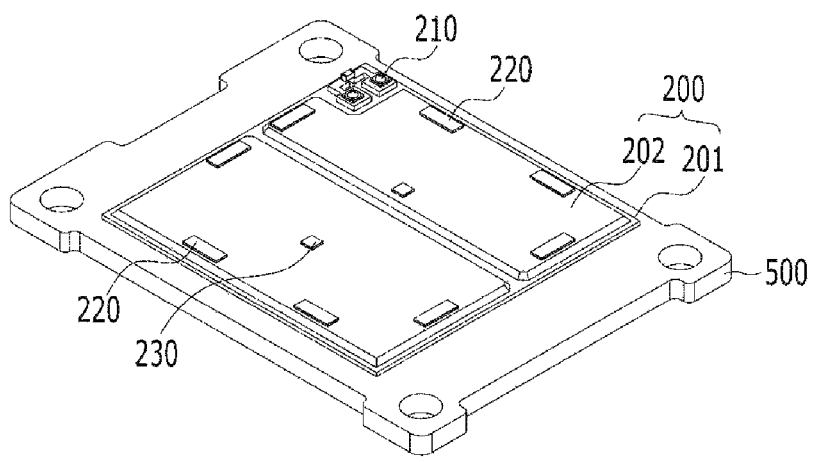
【FIG. 6】
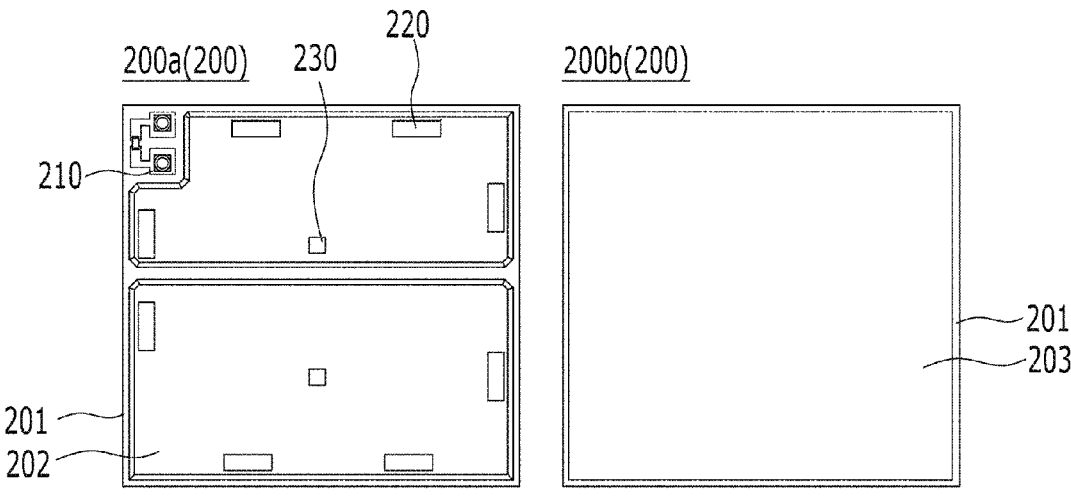

【FIG. 7】
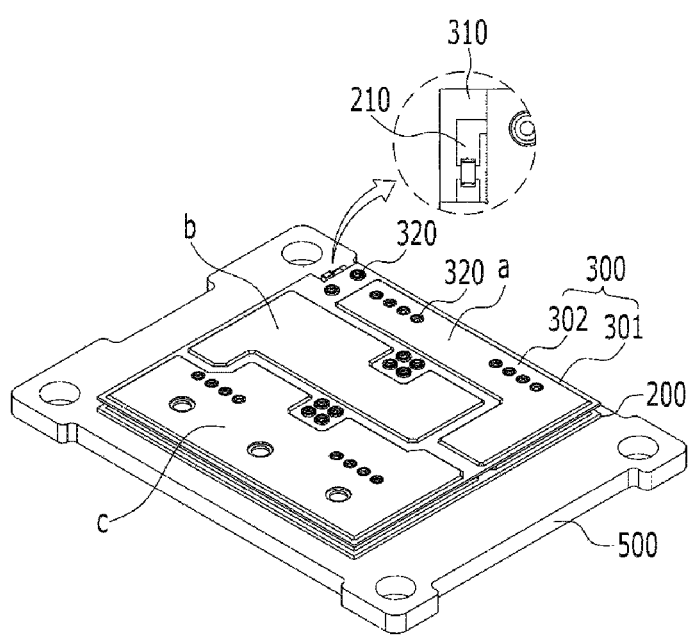
【FIG. 8】
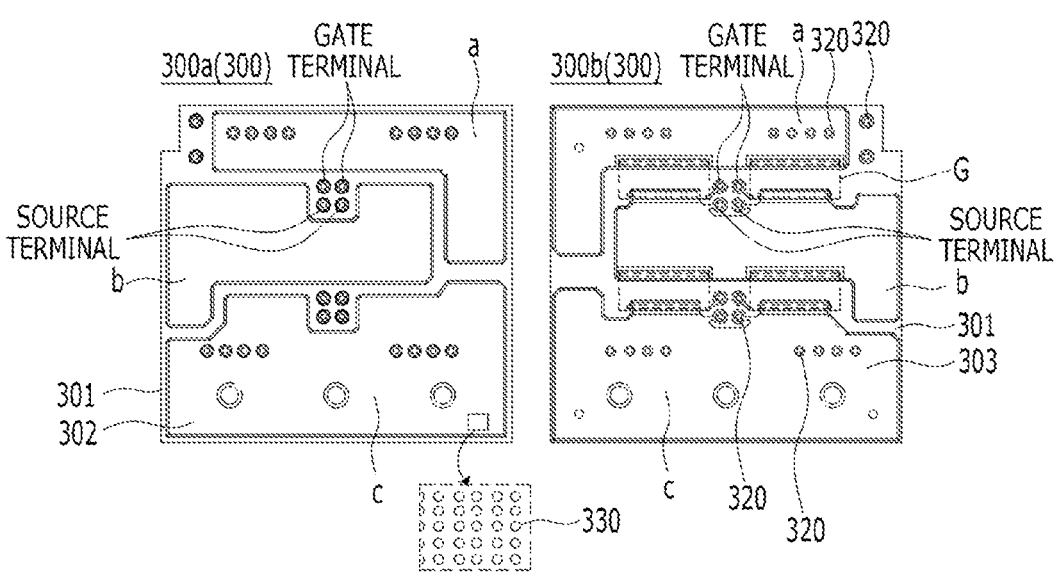

【FIG. 9】
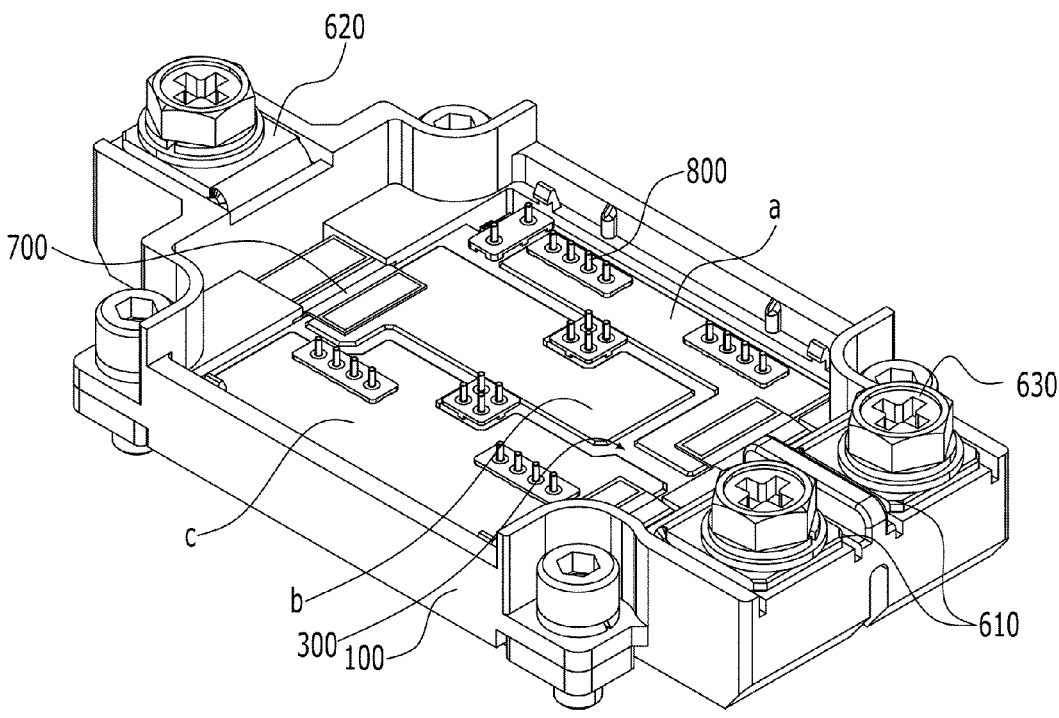
【FIG. 10】
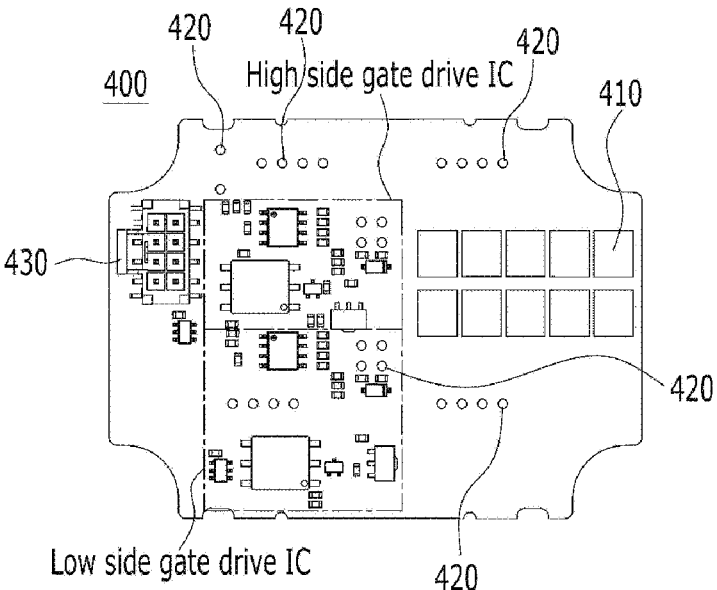

【FIG. 11】
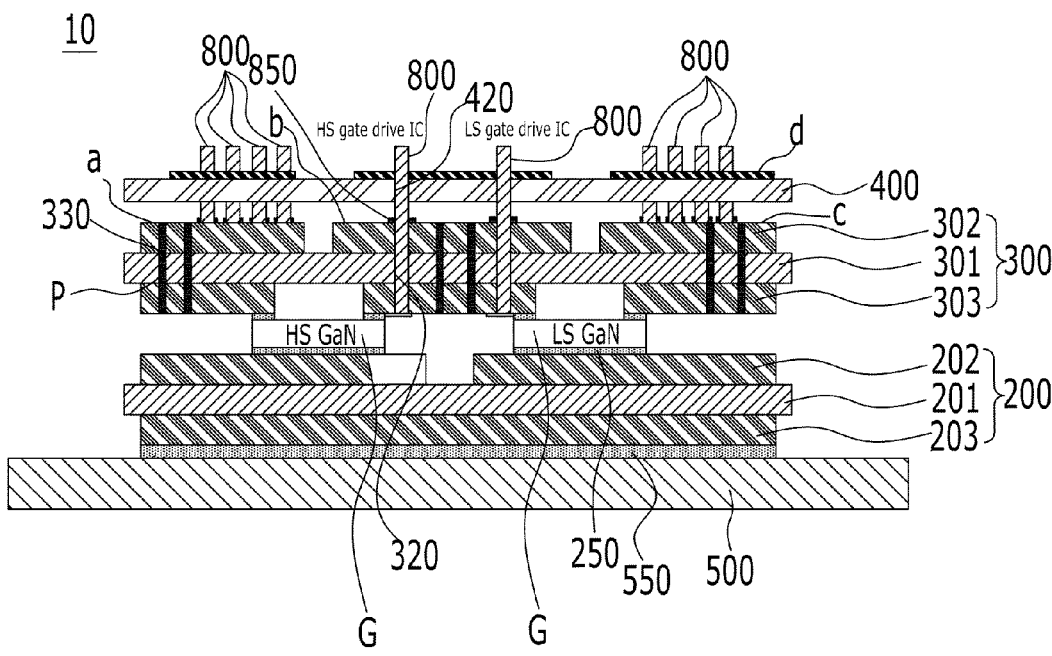
【FIG. 12】
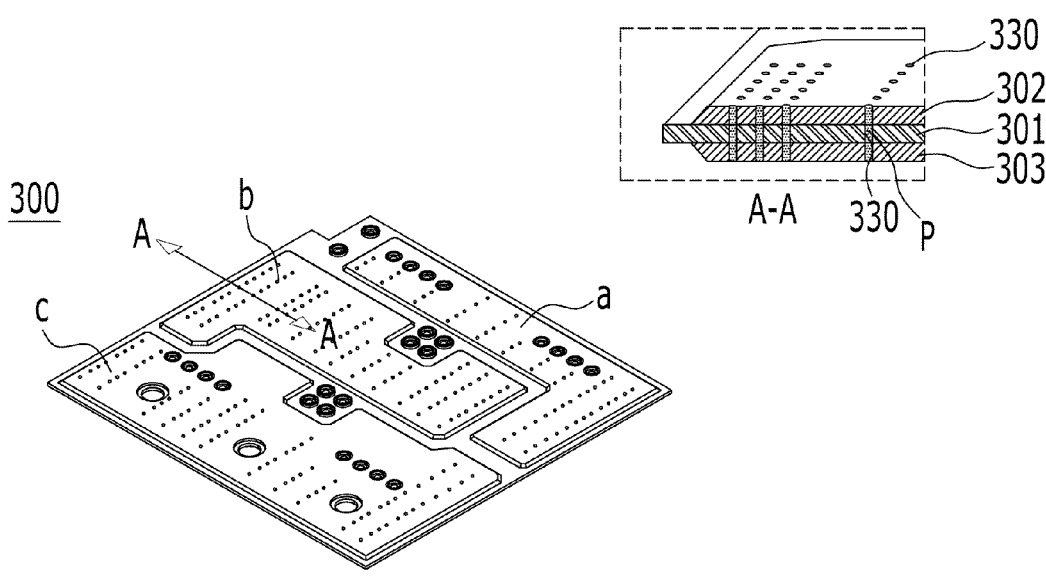

【FIG. 13】
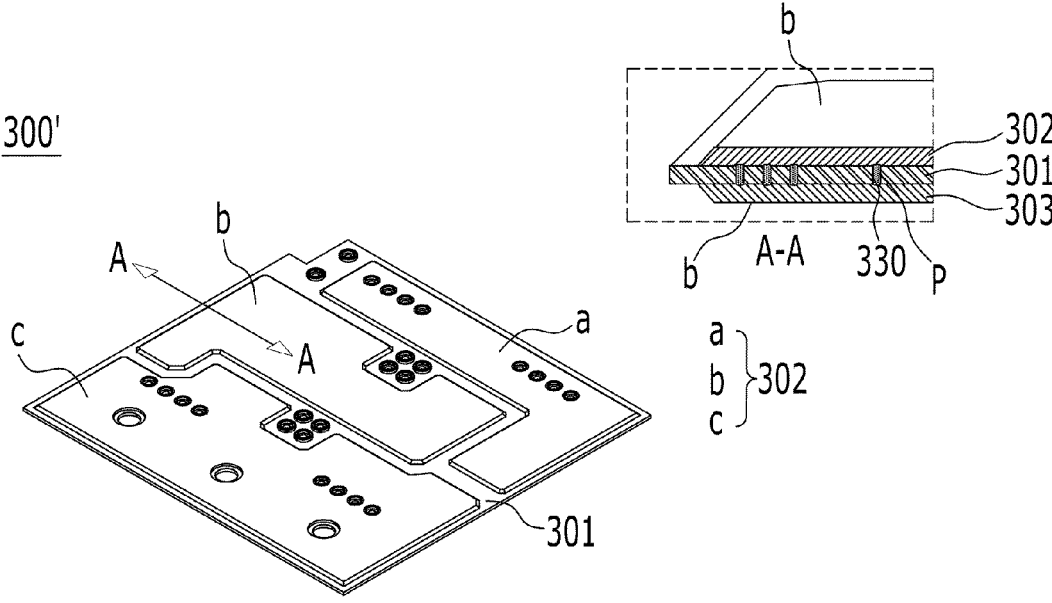
【FIG. 14】
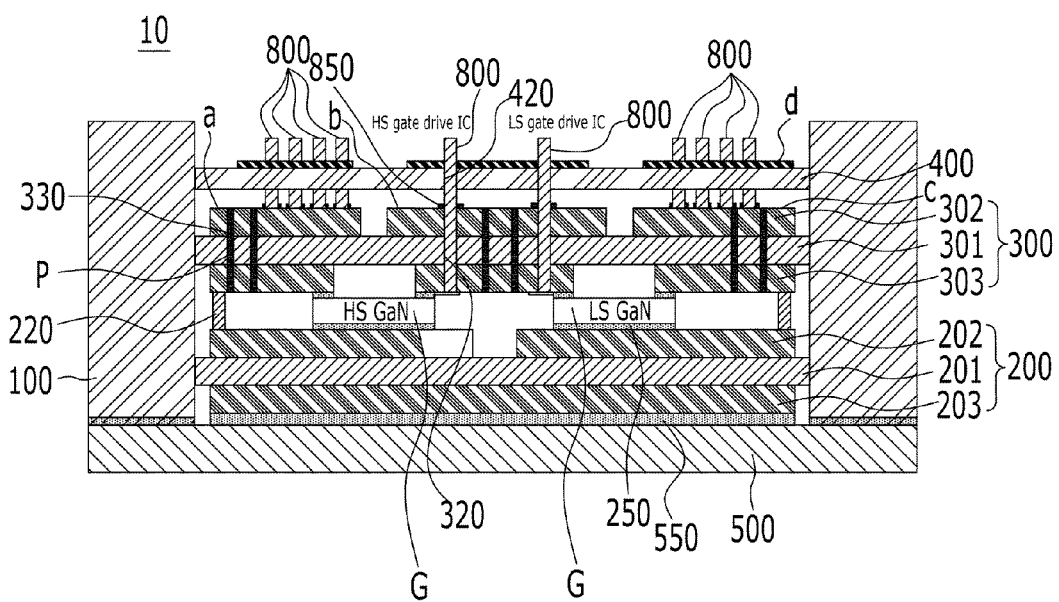

【FIG. 15】
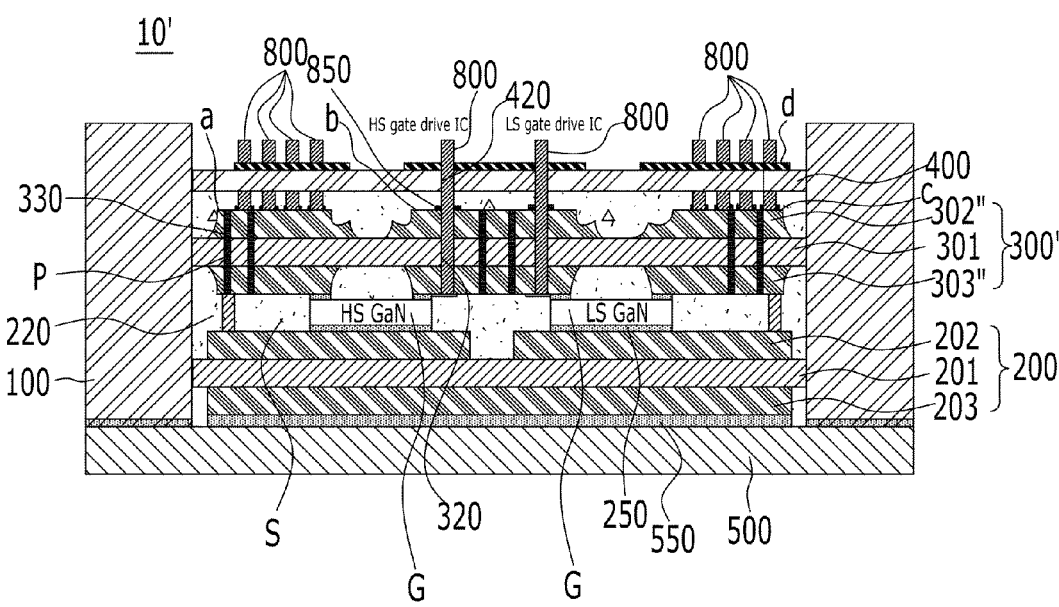
【FIG. 16】
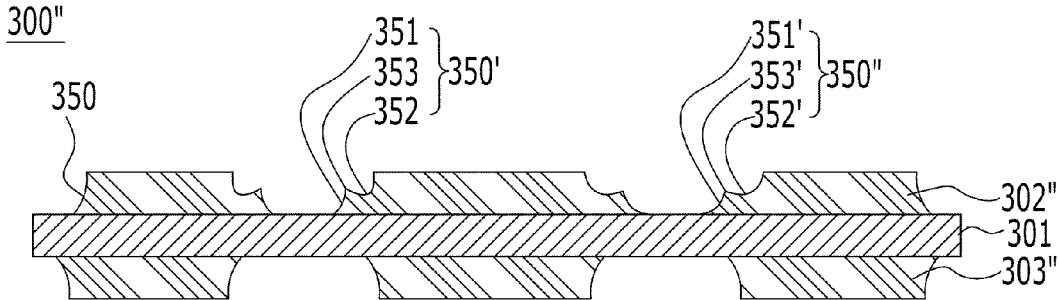

【FIG. 17】
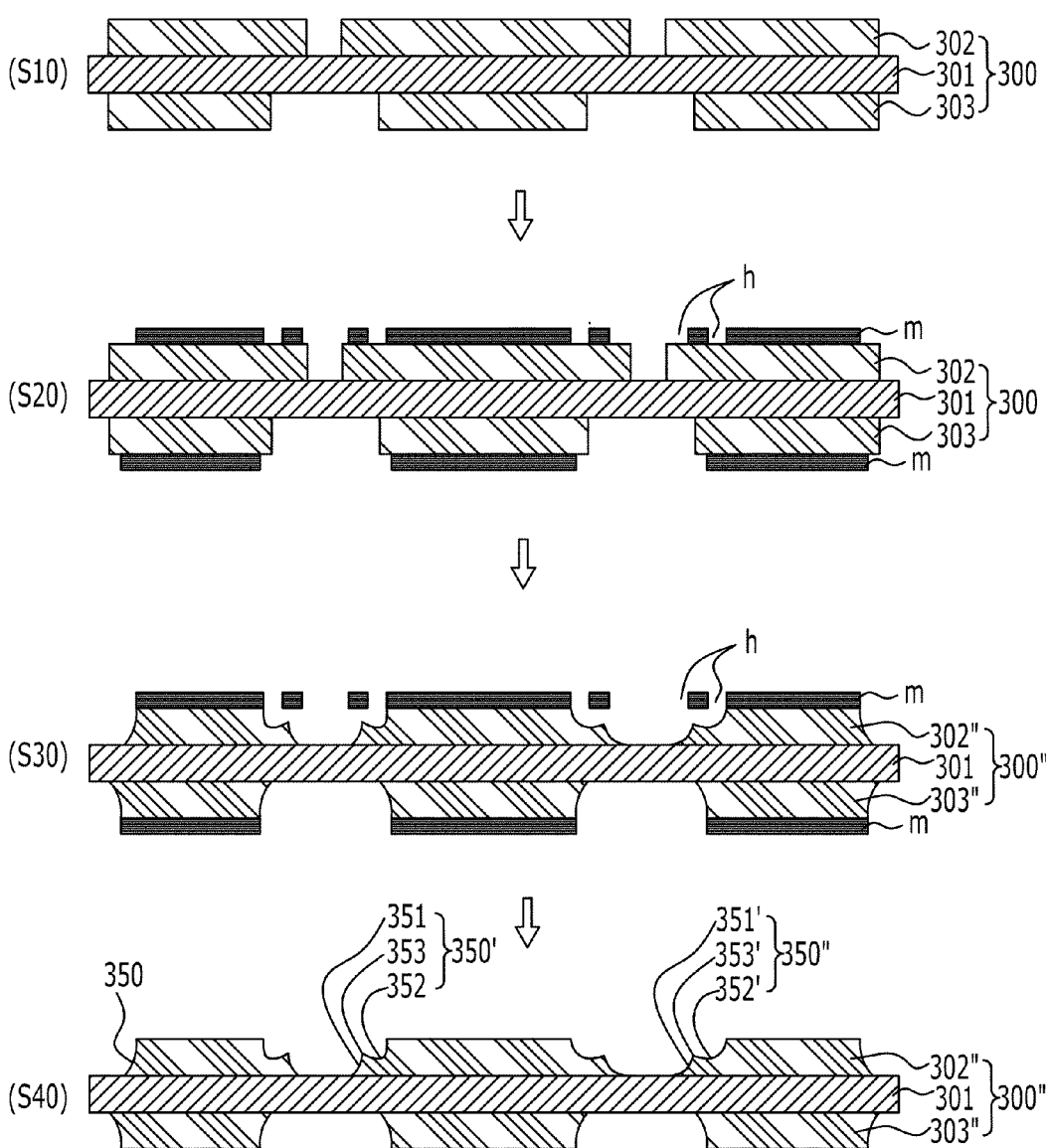

【FIG. 18】
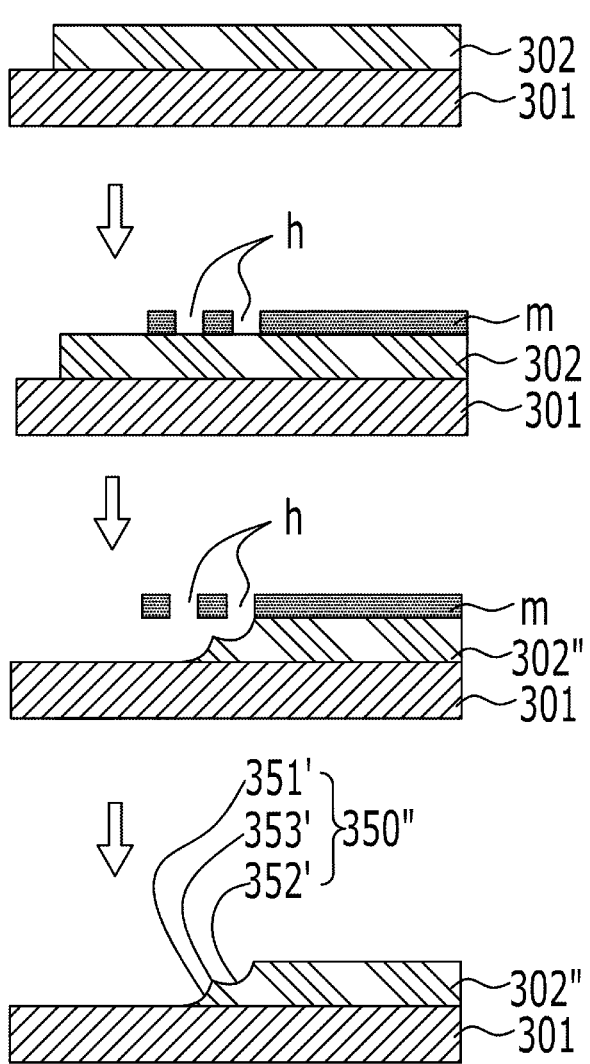

POWER MODULE

TECHNICAL FIELD

The present disclosure relates to a power module, and more particularly, to a power module having improved performance by applying a high-output power semiconductor chip and a method of manufacturing the same.

BACKGROUND ART

A power module is used to supply a high voltage and current in order to drive a motor in a hybrid vehicle or an electric vehicle.

A double-sided cooling power module among the power modules has substrates installed on and below a semiconductor chip, respectively, and has heat sinks provided on the outsides of the substrates, respectively. The use of the double-sided cooling power module tends to be gradually increased because the double-sided cooling power module has more excellent cooling performance than a cross-section cooling power module having a heat sink provided on one side thereof.

The double-sided cooling power module that is used in an electric vehicle, etc. generates high heat due to a high voltage and vibration during driving because a power semiconductor chip made of silicon carbide (SiC), gallium nitride (GaN), etc. is mounted between the two substrates. In order to solve such a problem, it is important to satisfy both high strength and high heat dissipation characteristics.

DISCLOSURE

Technical Problem

An object of the present disclosure is to provide a power module which has high strength and high heat dissipation characteristics and has an excellent bonding characteristic and which can reduce a volume by minimizing a current path and can improve efficiency and performance.

Furthermore, an object of the present disclosure is to provide a power module capable of minimizing a current path and improving moving efficiency of a high-speed current by applying a three-layer structure including a lower ceramic substrate, an upper ceramic substrate, and a PCB substrate and shortening an electrical connection distance the upper ceramic substrate and the PCB substrate.

Furthermore, an object of the present disclosure is to provide a power module capable of implementing performance thereof without being limited to an area and volume thereof.

Furthermore, an object of the present disclosure is to provide a power module which secures long lifespan and reliability by reducing a stress concentration by forming a curvature inclined part at an edge of a ceramic substrate.

Technical Solution

According to a characteristic of the present disclosure for achieving the object, the power module of the present disclosure includes a lower ceramic substrate, an upper ceramic substrate disposed over the lower ceramic substrate and configured to have a semiconductor chip mounted in a flip chip form on a lower surface of the upper ceramic substrate, and a PCB substrate disposed over the upper ceramic substrate.

The power module may include a plurality of through holes formed to correspond to the upper ceramic substrate and the PCB substrate, and a connection pin formed in the through hole of the upper ceramic substrate and the through hole of the PCB substrate in a way to penetrate through the through holes and configured to perpendicularly connect an electrode pattern of the ceramic substrate and an electrode pattern of the PCB substrate.

The connection pin formed in the through hole in a way to penetrate through the through holes may be bonded to an electrode pattern at an edge of the through hole by laser welding.

The power module may include a solder layer coated at the edge of the through hole, melted upon the laser welding, and configured to bond the connection pin to the electrode pattern at the edge of the through hole.

The upper ceramic substrate may include a ceramic base, electrode patterns formed on upper and lower surfaces of the ceramic base, a plurality of via holes formed to penetrate the upper ceramic substrate or the ceramic base up and down, and a metal filler filled into the via hole and configured to connect the electrode patterns of the upper and lower surfaces of the ceramic base.

The via hole has a diameter of 0.05 mm to 0.3 mm.

The metal filler may be made of one of Ag alloy series, Ag—Pd series, Ag-ceramic series, and Cu alloy series, or a mixed paste of them.

The via hole is uniformly distributed on an entire surface of the upper ceramic substrate or the ceramic base.

The power module includes a heat sink soldering-bonded to a lower surface of the lower ceramic substrate.

Each of the upper ceramic substrate and the lower ceramic substrate may be one of an active metal brazing (AMB) substrate, a direct bonding copper (DBC) substrate, a direct brazed aluminum (DBA) substrate, and a thick printing copper (TPC) substrate.

The power further includes a housing configured to have an empty space, opened up and down, formed at a center thereof and formed of an injection material. The lower ceramic substrate, the upper ceramic substrate, and the PCB substrate are sequentially installed in the empty space of the housing.

The power module includes a spacer disposed between the lower ceramic substrate and the upper ceramic substrate in a plural number and configured to regulate an isolation distance between the lower ceramic substrate and the upper ceramic substrate.

The upper ceramic substrate includes a ceramic base and a metal layer that forms an electrode pattern by being bonded to at least one surface of the ceramic base. A curvature inclined part is formed at an edge of the metal layer. The curvature inclined part protrudes in a direction of an outer circumference of the ceramic base.

The curvature inclined part is formed in a concave shape in a direction of the ceramic base, and has a shape in which a protruded length of the curvature inclined part is increased toward the direction of the ceramic base.

The curvature inclined part may have a multi-stage structure in which a plurality of concave parts is formed and a protruded part is formed at a part where the concave part and the concave part are met.

The protruded part may have a pointed shape.

The curvature inclined part may have a two-stage structure in which two concave parts are formed and a protruded part is formed at a part where the concave part and the concave part are met.

The curvature inclined part formed at the edge of the metal layer may have a mixed structure of a one-stage structure formed in a concave shape in the direction of the ceramic base and a multi-stage structure in which two or more concave parts have been formed in the direction of the ceramic base.

The curvature inclined part may be formed by disposing a photomask on one surface of the metal layer and etching the metal layer exposed by the photomask.

The curvature inclined part of the multi-stage structure may be formed by disposing, on the one surface of the metal layer, a photomask in which two or more holes have been adjacently formed and etching the metal layer exposed by the photomask.

Advantageous Effects

The present disclosure has effects in that it has high strength and high heat dissipation characteristics and has an excellent bonding characteristic, can reduce a volume by minimizing a current path, and can improve efficiency and performance due to optimization for high-speed switching.

Furthermore, the present disclosure has effects in that various output losses can be removed due to a minimized current path, the size of the power module can be reduced, and heat dissipation is also advantageous by fabricating the lower ceramic substrate, the upper ceramic substrate, and the PCB substrate as a three-layer integration type construction and perpendicularly connecting the electrical connection between the upper ceramic substrate and the PCB substrate by using the connection pin.

Furthermore, the present disclosure has effects in that a problem, such as a short or overheating, can be prevented and moving efficiency of a high-speed current can be improved because the distribution of a high current and the current-carrying of a high current are facilitated in a way that the electrode patterns of the upper and lower surfaces of the upper ceramic substrate are connected by forming the via holes in a plural number.

Furthermore, the present disclosure has effects in that the semiconductor chip can be protected because the lower ceramic substrate and the upper ceramic substrate are formed as an upper and lower duplex structure and the semiconductor chip is mounted therebetween and performance can be implemented without being limited to a fabrication area and volume of the power module because a driving element for operating the semiconductor chip is mounted by disposing the PCB substrate over the upper ceramic substrate.

Furthermore, the present disclosure has effects in that a problem, such as a short or overheating, can be prevented and moving efficiency of a high-speed current can be improved because the distribution of a high current and the current-carrying of a high current are facilitated in a way that the electrode patterns of the upper and lower surfaces of the upper ceramic substrate are connected by forming the via holes in the upper ceramic substrate and filling the via holes with the metal filler.

Furthermore, the present disclosure has effects in that long lifespan of the ceramic substrate can be secured and the reliability of the power module can be improved because a stress concentration attributable to heat and a stress concentration attributable to an electrical shock are reduced by forming the curvature inclined part having the one-stage structure or the multi-stage structure at an edge of the ceramic substrate.

4

DESCRIPTION OF DRAWINGS

FIG. 1 is a perspective view of a power module according to an embodiment of the present disclosure.

FIG. 2 is an exploded perspective view of the power module according to an embodiment of the present disclosure.

FIG. 3 is a side cross-sectional view of the power module according to an embodiment of the present disclosure.

FIG. 4 is a perspective view illustrating a housing according to an embodiment of the present disclosure.

FIG. 5 is a perspective view illustrating a lower ceramic substrate according to an embodiment of the present disclosure.

FIG. 6 is a diagram illustrating the upper surface and the lower surface of the lower ceramic substrate according to an embodiment of the present disclosure.

FIG. 7 is a perspective view illustrating an upper ceramic substrate according to an embodiment of the present disclosure.

FIG. 8 is a diagram illustrating the upper surface and the lower surface of the upper ceramic substrate according to an embodiment of the present disclosure.

FIG. 9 is a perspective view illustrating the state in which pin connections have been coupled to the upper ceramic substrate according to an embodiment of the present disclosure.

FIG. 10 is a plan view of a PCB substrate according to an embodiment of the present disclosure.

FIG. 11 is an internal construction diagram for describing a power module structure according to an embodiment of the present disclosure.

FIG. 12 is a perspective view illustrating a form in which via holes have been formed in the ceramic base of the upper ceramic substrate as an embodiment of the present disclosure.

FIG. 13 is a perspective view illustrating a form in which via holes have been formed in the upper ceramic substrate as a modified example of FIG. 12 of the present disclosure.

FIG. 14 is an internal construction diagram for describing a power module structure according to an embodiment of the present disclosure, and is a diagram that further includes a housing.

FIG. 15 is an internal construction diagram for describing a power module structure according to another embodiment of the present disclosure.

FIG. 16 is a cross-sectional view illustrating the upper ceramic substrate in the power module structure according to another embodiment of the present disclosure.

FIGS. 17 and 18 are process flows for describing a method of manufacturing the upper ceramic substrate according to another embodiment of the present disclosure.

DESCRIPTION OF REFERENCE NUMERALS

10: power module 100: housing
101: guide rib 102: locking projection
103: fastening hole 104: support hole
200: lower ceramic substrate 201: ceramic base
202, 203: metal layer 210: NTC temperature sensor
220: insulating spacer 230: interconnection spacer
300, 300', 300": upper ceramic substrate 301: ceramic base
302, 303, 302", 303": metal layer 310: cutting part
320, 420: through hole 330: via hole
350, 350', 350": curvature inclined part m: photomask
400: PCB substrate 401: guide groove

410: capacitor 420: through hole
500: heat sink 501: communication hole
610: first terminal 620: second terminal
630: support bolt 700: bus bar
G: semiconductor chip (GaN chip) 800: connection pin
850: solder layer S: silicon fluid
P: metal filler h: hole Best Mode Hereinafter, embodiments of the present disclosure are described in detail with reference to the accompanying drawings.

FIG. 1 is a perspective view of a power module according to an embodiment of the present disclosure. FIG. 2 is an exploded perspective view of the power module according to an embodiment of the present disclosure.

As illustrated in FIGS. 1 and 2, the power module 10 according to an embodiment of the present disclosure is an electronic part having a package form, which is formed by accommodating, in a housing 100, various components that form the power module. The power module 10 is formed in a form in which substrates and elements are disposed and protected within the housing 100.

The power module 10 may include multiple substrates and multiple semiconductor chips. The power module 10 according to an embodiment includes the housing 100, a lower ceramic substrate 200, an upper ceramic substrate 300, a PCB substrate 400, and a heat sink 500.

An empty space that is opened up and down is formed at the center of the housing 100. First terminals 610 and a second terminal 620 are disposed on both sides of the housing 100. The heat sink 500, the lower ceramic substrate 200, the upper ceramic substrate 300, and the PCB substrate 400 are sequentially stacked in the empty space at the center of the housing 100 at regular intervals. Support bolts 630 for connecting external terminals are fastened to the first terminals 610 and the second terminal 620 on both sides of the housing 100. The first terminals 610 and the second terminal 620 are used as the input and output stages of a power source.

As illustrated in FIG. 2, in the power module 10, the lower ceramic substrate 200, the upper ceramic substrate 300, and the PCB substrate 400 are sequentially accommodated in the empty space at the center of the housing 100. Specifically, the heat sink 500 is disposed at the lower surface of the housing 100. The lower ceramic substrate 200 is attached to the upper surface of the heat sink 500. The upper ceramic substrate 300 is disposed over the lower ceramic substrate 200 at a regular interval. The PCB substrate 400 is disposed over the upper ceramic substrate 300 at a regular interval.

The state in which the PCB substrate 400 has been disposed in the housing 100 may be fixed by guide grooves 401 and 402 formed at an edge of the PCB substrate 400 in a way to be concaved and a guide rib 101 and a locking projection 102 that are formed in the housing 100 in a way to correspond to the guide grooves 401 and 402. The multiple guide grooves 401 and 402 are formed to enclose the edge of the PCB substrate 400 according to an embodiment. The guide rib 101 formed on the inner surface of the housing 100 is guided through some guide grooves 401 of the multiple guide grooves 401 and 402. The locking projection 102 formed on the inner surface of the housing 100 passes through the remaining some guide grooves 402 of the multiple guide grooves 401 and 402, and is hung thereto.

Alternatively, the state in which the heat sink 500, the lower ceramic substrate 200, and the upper ceramic substrate

300 are accommodated in the empty space at the center of the housing 100 and the PCB substrate 400 is disposed at the upper surface thereof may also be fixed by a fastening bolt (not illustrated). However, fixing the PCB substrate 400 to the housing 100 through the guide groove and the locking projection structure reduces an assembly time and has a simple assembly process compared to a case in which the PCB substrate 400 is fixed to the housing 100 by the fastening bolt.

Fastening holes 103 are formed at four corners of the housing 100. The fastening holes 103 communicate with the communication holes 501 formed in the heat sink 500. Fixing bolts 150 are fastened to penetrate the fastening holes 103 and the communication holes 501. The ends of the fixing bolts 150 that have penetrated the fastening holes 103 and the communication holes 501 may be fastened to fixing holes of a fixing jig to be disposed at the lower surface of the heat sink 500.

Bus bars 700 are connected to the first terminals 610 and the second terminal 620. The bus bars 700 connect the first terminals 610 and the second terminal 620 to the upper ceramic substrate 300. Three bus bars 700 are provided. One of the bus bars 700 connects a + terminal, among the first terminals 610, to a first electrode pattern a of the upper ceramic substrate 300, and another of the bus bars 700 connects a − terminal, among the first terminals 610, to a third electrode pattern c. The remainder of the bus bars 700 connects the second terminal 620 to a second electrode pattern b. For the first electrode pattern a, the second electrode pattern b, and the third electrode pattern c, reference is made to FIGS. 7 and 10 to be described later.

FIG. 3 is a side cross-sectional view of the power module according to an embodiment of the present disclosure.

As illustrated in FIG. 3, the power module 10 is a duplex structure of the lower ceramic substrate 200 and the upper ceramic substrate 300. A semiconductor chip G is disposed between the lower ceramic substrate 200 and the upper ceramic substrate 300. The semiconductor chip G may be any one of a gallium nitride (GaN) chip, a metal oxide semiconductor field effect transistor (MOSFET), an insulated gate bipolar transistor (IGBT), a junction field effect transistor (JFET), and a high electric mobility transistor (HEMT), but the GaN chip is preferably used as the semiconductor chip G. The gallium nitride (GaN) chip G is a semiconductor chip that functions as a high power (300 A) switch and a high-speed (~1 MHz) switch. The GaN chip has advantages in that it is more resistant to heat than existing silicon-based semiconductor chip and can also reduce the size of the chip.

Each of the lower ceramic substrate 200 and the upper ceramic substrate 300 is formed of a ceramic substrate including a ceramic base and a metal layer brazing-bonded to at least one surface of the ceramic base so that heat dissipation efficiency of heat generated from the semiconductor chip G can be improved.

The ceramic base may be any one of alumina ($Al_2O_3$), AlN, SiN, and $Si_3N_4$, for example. The metal layer is a metal foil brazing-bonded to a surface of the ceramic base, and is formed in the form of an electrode pattern on which the semiconductor chip G is mounted and an electrode pattern on which a driving element is mounted. For example, the metal layer is formed in the form of an electrode pattern in an area on which a semiconductor chip or a peripheral part will be mounted. The metal foil is an aluminum foil or a copper foil, for example. The metal foil is sintered on the ceramic base at 780° C. to 1100° C. and brazing-bonded to the ceramic base, for example. Such a ceramic substrate is called an AMB substrate. An embodiment is described by taking the AMB substrate as an example, but may apply a DBC substrate, a TPC substrate, or a DBA substrate. However, in terms of durability and heat dissipation efficiency, the AMB substrate is most appropriate. For the reason, the lower ceramic substrate 200 and the upper ceramic substrate 300 are AMB substrates, for example.

The PCB substrate 400 is disposed over the upper ceramic substrate 300. That is, the power module 10 is constituted with a three-layer structure of the lower ceramic substrate 200, the upper ceramic substrate 300, and the PCB substrate 400. Heat dissipation efficiency is improved by disposing the semiconductor chip G for control for high power between the upper ceramic substrate 300 and the lower ceramic substrate 200. Damage to the PCB substrate 400 attributable to heat which occurs in the semiconductor chip G is prevented by disposing the PCB substrate 400 for control for low power at the top of the power module 10. The lower ceramic substrate 200, the upper ceramic substrate 300, and the PCB substrate 400 may be connected or fixed by pins.

The heat sink 500 is disposed under the lower ceramic substrate 200. The heat sink 500 is for discharging heat that is generated from the semiconductor chip G. The heat sink 500 is formed in a quadrangle plate shape having a predetermined thickness. The heat sink 500 is formed to have an area corresponding to the housing 100, and may be formed of a copper or aluminum material in order to improve heat dissipation efficiency.

Hereinafter, characteristics for each component of the power module of the present disclosure are more specifically described. In a drawing that describes the characteristics for each component of the power module, there is a portion that has been expressed by enlarging or exaggerating the drawing in order to highlight the characteristics of each component. Accordingly, a portion that is not partially identical with some of the basic drawing illustrated in FIG. 1 may be present.

FIG. 4 is a perspective view illustrating a housing according to an embodiment of the present disclosure.

As illustrated in FIG. 4, the housing 100 has an empty space formed at the center thereof, and has the first terminals 610 and the second terminal 620 disposed at both ends thereof. The housing 100 may have the first terminals 610 and the second terminal 620 formed at both ends thereof by using an insert injection method in a way to be integrally fixed thereto.

In the existing power module, a connection pin is applied to the housing through insert injection in order to connect isolated circuits. In contrast, in the present embodiment, the housing 100 has a shape that is manufactured by excluding the connection pin upon manufacturing. This improves flexibility for torsion moment of the power module by simplifying a shape of the power module because the connection pin is not disposed within the housing 100.

The housing 100 has the fastening holes 103 formed at the four corners thereof. The fastening holes 103 communicate with the communication holes 501 formed in the heat sink 500. The first terminals 610 and the second terminal 620 have support holes 104 formed therein. The support bolts 630 for connecting the first terminals 610 and the second terminal 620 to external terminals, such as a motor, are fastened to support bolts 630 (refer to FIG. 9).

The housing 100 is formed of an insulating material. The housing 100 may be formed of an insulating material so that heat generated from the semiconductor chip G is not delivered to the PCB substrate 400 over the housing 100, through the housing 100.

Alternatively, a heat dissipation plastic material may be applied to the housing 100. The heat dissipation plastic material may be applied to the housing 100 so that heat generated from the semiconductor chip G can be discharged to the outside through the housing 100. For example, the housing 100 may be formed of engineering plastics. The engineering plastics has high heat resistance, excellent strength, chemical resistance, and wear resistance, and may be used for a long time at 150° C. or more. The engineering plastics may be made of one material among polyamide, polycarbonate, polyester, and modified polyphenylene oxide.

The semiconductor chip G performs a repetitive operation as a switch. Accordingly, the housing 100 is subjected to stress attributable to a high temperature and a temperature change, but the engineering plastics is relatively stable with respect to a high temperature and a temperature change and is excellent in a heat dissipation characteristic compared to common plastics because the engineering plastics has excellent high temperature stability.

In an embodiment, the housing 100 may have been manufactured by applying a terminal made of aluminum or copper to the engineering plastic material through insert injection. The housing 100 made of the engineering plastic material discharges heat to the outside by propagating heat. The housing 100 may more increase thermal conductivity than a common engineering plastic material and may become light-weight and high heat dissipation engineering plastics, compared to aluminum by filling resin with a high heat conductivity filler.

Alternatively, the housing 100 may have a heat dissipation characteristic by coating a graphene heat dissipation coating material on the inside or outside of engineering plastics or high strength plastic material.

FIG. 5 is a perspective view illustrating a lower ceramic substrate according to an embodiment of the present disclosure.

As illustrated in FIGS. 3 and 5, the lower ceramic substrate 200 is attached to the upper surface of the heat sink 500. Specifically, the lower ceramic substrate 200 is disposed between the semiconductor chip G and the heat sink 500. The lower ceramic substrate 200 plays a role to deliver, to the heat sink 500, heat generated from the semiconductor chip G and to prevent a short by insulating the semiconductor chip G and the heat sink 500.

The lower ceramic substrate 200 may be soldered and bonded to the upper surface of the heat sink 500. The heat sink 500 is formed to have an area corresponding to the housing 100, and may be formed of a copper material in order to improve heat dissipation efficiency. SnAg, SnAgCu, etc. may be used as a solder for the soldering and bonding.

FIG. 6 is a diagram illustrating the upper surface and the lower surface of the lower ceramic substrate according to an embodiment of the present disclosure.

As illustrated in FIGS. 5 and 6, the lower ceramic substrate 200 includes a ceramic base 201 and metal layers 202 and 203 brazing-bonded to the upper surface and the lower surface of the ceramic base 201. In the lower ceramic substrate 200, the ceramic base 201 may have a thickness of 0.68 t, and each of the metal layers 202 and 203 formed at the upper surface and the lower surface of the ceramic base 201 may have a thickness of 0.8 t, for example.

The metal layer 202 at the upper surface 200*a* of the lower ceramic substrate 200 may be an electrode pattern on which a driving element is mounted. The driving element mounted on the lower ceramic substrate 200 may be an NTC temperature sensor 210. The NTC temperature sensor 210 is mounted on the upper surface of the lower ceramic substrate 200. The NTC temperature sensor 210 is for providing information on a temperature within the power module attributable to heat generated from the semiconductor chip G. The metal layer 203 at the lower surface 200*b* of the lower ceramic substrate 200 may be formed on the entire lower surface of the lower ceramic substrate 200 in order to facilitate the delivery of heat to the heat sink 500.

An insulating spacer 220 is bonded to the lower ceramic substrate 200. The insulating spacer 220 is bonded to the upper surface of the lower ceramic substrate 200, and defines an isolation distance between the lower ceramic substrate 200 and the upper ceramic substrate 300.

The insulating spacer 220 defines the isolation distance between the lower ceramic substrate 200 and the upper ceramic substrate 300, thereby increasing heat dissipation efficiency of heat generated from the semiconductor chip G mounted on the lower surface of the upper ceramic substrate 300 and preventing an electrical shock, such as a short, by preventing interference between the semiconductor chips G.

Multiple insulating spacers 220 are bonded at predetermined intervals by enclosing an edge at the upper surface of the lower ceramic substrate 200. An interval between the insulating spacers 220 is used as a space for increasing heat dissipation efficiency. In the drawing, the insulating spacers 220 are disposed to enclose the edge of the lower ceramic substrate 200. For example, eight insulating spacers 220 are disposed at regular intervals.

The insulating spacers 220 are integrally bonded to the lower ceramic substrate 200. The insulating spacers 220 may be applied for the purpose of checking the alignment of the upper ceramic substrate 300 when the upper ceramic substrate 300 is disposed over the lower ceramic substrate 200. In the state in which the insulating spacers 220 have been bonded to the lower ceramic substrate 200, when the upper ceramic substrate 300 on which the semiconductor chip G has been mounted is disposed over the lower ceramic substrate 200, the insulating spacers 220 may be applied for the purpose of checking the alignment of the upper ceramic substrate 300. Furthermore, the insulating spacers 220 contribute to preventing the bending of the lower ceramic substrate 200 and the upper ceramic substrate 300 by supporting the lower ceramic substrate 200 and the upper ceramic substrate 300.

The insulating spacers 220 may be formed of a ceramic material in order to insulate a chip mounted on the lower ceramic substrate 200 and a chip mounted on the upper ceramic substrate 300 and a part. For example, the insulating spacers may be formed of one kind selected among $Al_2O_3$, ZTA, $Si_3N_4$, and AlN or a mixed alloy of two or more of them. $Al_2O_3$, ZTA, $Si_3N_4$, and AlN are insulating materials having excellent mechanical strength and heat-resisting properties.

The insulating spacers 220 are brazing-bonded to the lower ceramic substrate 200. The insulating spacers 220 are brazing-bonded to the lower ceramic substrate 200 because the substrate may be broken due to thermal and mechanical shocks upon soldering or pressurization sintering if the insulating spacers 220 are soldered and bonded to the lower ceramic substrate 200. A brazing bonding layer including an AgCu layer and a Ti layer may be used for the brazing bonding. Heat treatment for the brazing may be performed at 780° C. to 900° C. After the brazing, the insulating spacers 220 are integrally formed with the metal layer 202 of the lower ceramic substrate 200. The thickness of the brazing bonding layer is 0.005 mm to 0.08 mm, which is thin to the extent that the height of the insulating spacers is not affected and has high bonding strength.

An interconnection spacer 230 is installed between the lower ceramic substrate 200 and the upper ceramic substrate 300. The interconnection spacer 230 may perform an electrical connection between electrode patterns instead of a connection pin in a substrate having an upper and lower duplex structure. The interconnection spacer 230 can increase bonding strength and improve electrical characteristics by directly connecting the substrates, while preventing an electrical loss and shot. The interconnection spacer 230 may have one end bonded to the electrode pattern of the lower ceramic substrate 200 by using a brazing bonding method. Furthermore, the interconnection spacer 230 may have the other end opposite to the one end bonded to the electrode pattern of the upper ceramic substrate 300 by using a brazing bonding method or a soldering bonding method. The interconnection spacer 230 may be a Cu or Cu+CuMo alloy.

FIG. 7 is a perspective view illustrating an upper ceramic substrate according to an embodiment of the present disclosure. FIG. 8 is a diagram illustrating the upper surface and the lower surface of the upper ceramic substrate according to an embodiment of the present disclosure.

As illustrated in FIGS. 7 and 8, the upper ceramic substrate 300 is disposed over the lower ceramic substrate 200.

The upper ceramic substrate 300 is an intermediate substrate having a stack structure. The upper ceramic substrate 300 has the semiconductor chip G mounted on a lower surface thereof and a high side circuit and a low side circuit for high-speed switching constructed on the lower surface.

The upper ceramic substrate 300 includes a ceramic base 301 and metal layers 302 and 303 brazing-bonded to the upper surface and the lower surface of the ceramic base 301. In the upper ceramic substrate 300, the ceramic base has a thickness of 0.38 t, and each of electrode patterns of the upper surface 300*a* and the lower surface 300*b* of the ceramic base has a thickness of 0.3 t, for example. The ceramic substrate is not twisted upon brazing only when the patterns at the upper surface and the lower surface thereof have the same thickness.

The electrode patterns that are formed by the metal layer 302 at the upper surface of the upper ceramic substrate 300 are divided into the first electrode pattern a, the second electrode pattern b, and the third electrode pattern c. The electrode patterns that are formed by the metal layer 303 at the lower surface of the upper ceramic substrate 300 correspond to the electrode patterns that are formed by the metal layer 302 at the upper surface of the upper ceramic substrate 300. Dividing the electrode patterns at the upper surface of the upper ceramic substrate 300 into the first electrode pattern a, the second electrode pattern b, and the third electrode pattern c is for division into a high side circuit and a low side circuit for high-speed switching.

The semiconductor chip G is provided at the lower surface 300*b* of the upper ceramic substrate 300 in a flip chip form by an adhesive layer, such as a solder or an Ag paste. As the semiconductor chip G is provided in the flip chip form at the lower surface of the upper ceramic substrate 300, an inductance value can be lowered as much as possible because wire bonding is omitted. Accordingly, heat dissipation performance can also be improved.

As illustrated in FIG. 8, the semiconductor chip G may be connected in parallel by two for high-speed switching. Two semiconductor chips G are disposed at a location at which the first electrode pattern a and the second electrode pattern b, among the electrode patterns of the upper ceramic substrate 300, are connected. The remaining two semiconductor chips G are disposed in parallel at a location at which the second electrode pattern b and the third electrode pattern c are connected. For example, the capacity of one semiconductor chip G is 150 A. Accordingly, the capacity of two semiconductor chips G become 300 A by connecting the two semiconductor chips G in parallel. The semiconductor chip G is a GaN chip.

The purpose of the power module using the semiconductor chip G is for high-speed switching. For the high-speed switching, it is important to connect the gate drive IC terminal and a gate terminal of the semiconductor chip G at a very short distance. Accordingly, a connection distance between the gate drive IC and the gate terminal is minimized by connecting the semiconductor chips G in parallel. Furthermore, in order for the semiconductor chip G to switch at high speed, it is important for the gate terminal and source terminal of the semiconductor chip G to maintain the same interval. To this end, the gate terminal and the source terminal may be disposed so that a connection pin is connected to the middle between the semiconductor chip G and the semiconductor chips G. A problem occurs if the gate terminal and the source terminal do not maintain the same interval or the length of a pattern is changed.

The gate terminal is a terminal that turns on/off the semiconductor chip G by using a low voltage. The gate terminal may be connected to the PCB substrate 400 through the connection pin. The source terminal is a terminal to and from which a high current is input and output. The semiconductor chip G includes a drain terminal. The source terminal and the drain terminal may change the directions of currents thereof by being divided into an N type and a P type. The source terminal and the drain terminal are responsible for the input and output of a current through the first electrode pattern a, the second electrode pattern b, and the third electrode pattern c, that is, the electrode patterns on which the semiconductor chip G is mounted. The source terminal and the drain terminal are connected to the first terminal 610 and the second terminal 620 in FIG. 1, which are responsible for the input and output of a power source.

Referring to FIGS. 1 and 8, the first terminal 610 illustrated in FIG. 1 includes a + terminal and a − terminal. A power source that is introduced into the + terminal of the first terminal 610 is output to the second terminal 620 through the first electrode pattern a of the upper ceramic substrate 300 illustrated in FIG. 8, the semiconductor chip G disposed between the first electrode pattern a and the second electrode pattern b, and the second electrode pattern b. Furthermore, a power source introduced into the second terminal 620 illustrated in FIG. 1 is output to the − terminal of the first terminal 610 through the second electrode pattern b illustrated in FIG. 8, the semiconductor chip G disposed between the second electrode pattern b and the third electrode pattern c, and the third electrode pattern c. For example, a power that is introduced from the first terminal 610 and output to the second terminal 620 through the semiconductor chip G becomes a high side. A power source that is introduced from the second terminal 620 and output to the first terminal 610 through the semiconductor chip G becomes a low side.

As illustrated in FIG. 7, the upper ceramic substrate 300 may have a cutting part 310 formed at a portion corresponding to the NTC temperature sensor 210. The NTC temperature sensor 210 is mounted on the upper surface of the lower ceramic substrate 200. The NTC temperature sensor 210 is for providing information on a temperature within the power module, which is attributable to heat generated from the semiconductor chip G. However, interference occurs between the NTC temperature sensor 210 and the upper ceramic substrate 300 because the thickness of the NTC temperature sensor 210 is greater than an interval between the lower ceramic substrate 200 and the upper ceramic substrate 300. In order to solve such a problem, the cutting part 310 is formed by cutting a portion of the upper ceramic substrate 300 that interferes with the NTC temperature sensor 210.

A silicon fluid or epoxy for molding may be injected into the space between the upper ceramic substrate 300 and the lower ceramic substrate 200 through the cutting part 310. In order to insulate the upper ceramic substrate 300 and the lower ceramic substrate 200, the silicon fluid or the epoxy needs to be injected. In order to inject the silicon fluid or the epoxy into the upper ceramic substrate 300 and the lower ceramic substrate 200, the cutting part 310 may be formed by cutting one surface of the upper ceramic substrate 300. The cutting part 310 is formed at a location corresponding to the NTC temperature sensor 210, and can also prevent interference between the upper ceramic substrate 300 and the NTC temperature sensor 210. The silicon fluid or the epoxy may be filled into the space between the lower ceramic substrate 200 and the upper ceramic substrate 300 and the space between the upper ceramic substrate 300 and the PCB substrate 400 for the purposes of protecting the semiconductor chip G, reducing vibration, and insulation.

A through hole 320 is formed in the upper ceramic substrate 300. The through hole 320 is for connecting the semiconductor chip G mounted on the upper ceramic substrate 300 and a driving element mounted on the PCB substrate 400 at the shortest distance and connecting the NTC temperature sensor 210 mounted on the lower ceramic substrate 200 and a driving element mounted on the PCB substrate 400 at the shortest distance in an upper and lower duplex substrate structure.

Eight through holes 320 are formed at locations at which the semiconductor chip is installed by two. Two through holes 320 are installed at a location at which the NTC temperature sensor is installed. A total of ten through holes 320 may be formed. Furthermore, multiple through holes 320 may be formed at portions of the upper ceramic substrate 300 in which the first electrode pattern a and the third electrode pattern c have been formed.

The multiple through holes 320 formed in the first electrode pattern a enable a current that is introduced into the first electrode pattern a at the upper surface of the upper ceramic substrate 300 to move to the first electrode pattern a formed at the lower surface of the upper ceramic substrate 300 and to be introduced into the semiconductor chip G. The multiple through holes 320 formed in the third electrode pattern c enable a current that is introduced into the semiconductor chip G to move to the third electrode pattern c at the upper surface of the upper ceramic substrate 300 through the third electrode pattern c at the lower surface of the upper ceramic substrate 300.

The diameter of the through hole 320 may be 0.5 mm to 5.0 mm. A connection pin is installed in the through hole 320, and is connected to the electrode pattern of the PCB substrate, which may be connected to a driving element mounted on the PCB substrate 400 through the through hole 320. In the upper and lower duplex substrate structure, the connection between the electrode patterns through the through hole 320 and the connection pin installed in the through hole 320 can contribute to improving restrictions according to the size of the power module by removing various output losses through the shortest distance connection.

A plurality of via holes 330 may be formed in the electrode pattern of the upper ceramic substrate 300. The via holes 330 may be processed to be at least 50% or more compared to the area of the substrate. It has been described that the area of the via holes 330 is applied as being at least 50% or more compared to the area of the substrate, for example, but the present disclosure is not limited thereto and the area of the via holes 330 may be processed to be 50% or less compared to the area of the substrate.

For example, 152 via holes may be formed in the first electrode pattern a, 207 via holes may be formed in the second electrode pattern b, and 154 via holes may be formed in the third electrode pattern c. The plurality of via holes 330 formed in each of the electrode patterns is for high current electrification and a high current distribution. If the electrode pattern at the upper surface of the upper ceramic substrate 300 and the electrode pattern at the lower surface of the upper ceramic substrate 300 become conductive to each other in one slot form, a problem, such as a short or overheating, may occur because a high current flows into only one side.

The via hole 330 is filled with a conductive substance. The conductive substance may be Ag or an Ag alloy. The Ag alloy may be an Ag—Pd paste. The conductive substance that is filled into the via hole 330 electrically connects the electrode pattern at the upper surface of the upper ceramic substrate 300 and the electrode pattern at the lower surface of the upper ceramic substrate 300. The via hole 330 may be formed by laser processing. The via hole 330 may be seen in the enlarged view of FIG. 8.

FIG. 9 is a perspective view illustrating the state in which pin connections have been coupled to the upper ceramic substrate according to an embodiment of the present disclosure.

As illustrated in FIG. 9, a connection pin 800 is inserted into the through hole (reference numeral 320 in FIG. 7) formed at a location adjacent to the semiconductor chip G in the upper ceramic substrate 300. The connection pin 800 inserted into the through hole 320 formed at the location adjacent to the semiconductor chip G may be inserted into the through holes 420 formed at a location corresponding to the PCB substrate (reference numeral 400 in FIG. 10), and may connect the gate terminal on which the semiconductor chip G is mounted and the electrode pattern of the PCB substrate 400.

Furthermore, the connection pin 800 is inserted into the through hole 320 formed at a location adjacent to the NTC temperature sensor 210 in the upper ceramic substrate 300. The connection pin 800 inserted into the through hole 320 formed at the location adjacent to the NTC temperature sensor 210 may be inserted into the through hole 420 formed at the location corresponding to the PCB substrate 400, and may connect the terminal of the NTC temperature sensor 210 and the electrode pattern of the PCB substrate 400.

Furthermore, the connection pin 800 is inserted into multiple through hole 320 that are formed in a row in the first electrode pattern a and third electrode pattern c of the upper ceramic substrate 300. The connection pin 800 inserted into the multiple through holes 320 formed in the first electrode pattern a and the third electrode pattern c may be inserted into the through hole 420 formed at the location corresponding to the PCB substrate 400, and may connect the semiconductor chip G to the capacitor 410 of the PCB substrate 400.

The connection pin 800 removes various output losses and enables high-speed switching by connecting, at the shortest distance, the semiconductor chip G mounted on the upper ceramic substrate 300 and a driving element mounted on the PCB substrate 400.

FIG. 10 is a plan view of a PCB substrate according to an embodiment of the present disclosure.

As illustrated in FIG. 10, a driving element for switching the semiconductor chip G or switching a GaN chip (a semiconductor chip) by using information detected by the NTC temperature sensor (reference numeral 210 in FIG. 7) is mounted on the PCB substrate 400. The driving element includes a gate drive IC.

A capacitor 410 is mounted on the upper surface of the PCB substrate 400. The capacitor 410 is mounted on the upper surface of the PCB substrate 400, that is, a location between the semiconductor chip G disposed to connect the first electrode pattern a and second electrode pattern b of the upper ceramic substrate 300 and the semiconductor chips G is disposed to connect the second electrode pattern b and third electrode pattern c of the upper ceramic substrate 300.

When the capacitor 410 is mounted on the upper surface of the PCB substrate 400, that is, the location between the semiconductor chips G, it is more advantageous in high-speed switching because the semiconductor chip G and a drive IC circuit can be connected at the shortest distance by using a connection pin (reference numeral 900 in FIG. 10). For example, ten capacitors 410 may be connected in parallel in order to satisfy the capacity thereof. In order to secure 2.5 µF or more for a decoupling use at the input stage of the capacitors, the capacity can be secured by connecting ten high-voltage capacitors. The gate drive IC circuit includes a high side gate drive IC and a low side gate drive IC.

MODE FOR INVENTION

FIG. 11 is an internal construction diagram for describing a power module structure according to an embodiment of the present disclosure. Only major parts of the internal construction diagram of FIG. 11 are exaggerated and illustrated so that an internal structure of the actual power module illustrated in FIG. 3 can be easily identified. Accordingly, an actual side view of FIG. 3 and the construction diagram of FIG. 11 may include some portions that are not identical with each other.

As illustrated in FIG. 11, the power module 10 has a three-layer integration type structure including the lower ceramic substrate 200, the upper ceramic substrate 300, and the PCB substrate 400.

The upper ceramic substrate 300 is disposed over the lower ceramic substrate 200 in a way to be spaced apart from the lower ceramic substrate 200. The semiconductor chip G is mounted on the lower surface of the upper ceramic substrate 300, and is disposed between the lower ceramic substrate 200 and the upper ceramic substrate 300. The semiconductor chip G for control for high power is disposed between the lower ceramic substrate 200 and the upper ceramic substrate 300, and improves heat dissipation efficiency. Furthermore, if the lower ceramic substrate 200 and the upper ceramic substrate 300 are formed as an upper and lower duplex structure and the high-output semiconductor chip G is disposed between the lower ceramic substrate 200 and the upper ceramic substrate 300, performance of the power module 10 can be implemented without being limited to an area and volume of the power module 10 because the semiconductor chip G is protected against an external environment.

The PCB substrate 400 is disposed over the upper ceramic substrate 300. The PCB substrate 400 for control for low power is disposed over the upper ceramic substrate 300 in a way to be spaced apart from the upper ceramic substrate 300, and prevents damage to the PCB substrate 400 attributable to heat generated from the semiconductor chip G.

A driving element for switching the semiconductor chip G, a capacitor for making a voltage continuous, a connector, etc. are mounted on the upper surface of the PCB substrate 400. The driving element may include a gate drive IC circuit. The gate drive IC circuit may include a high side gate drive IC and a low side gate drive IC. The PCB substrate 400 may have a multi-layer structure in which an internal electrode pattern is formed between a plurality of insulating layers and an upper electrode pattern is formed at the highest layer of the plurality of insulating layers.

The through holes 320 and 420 are formed in the upper ceramic substrate 300 and the PCB substrate 400. The connection pin 800 is formed in the through holes 320 and 420 formed in the upper ceramic substrate 300 and the PCB substrate 400 in a way to penetrate through the through holes. The connection pin 800 perpendicularly connects the electrode patterns a, b, c, and d that are formed in the upper ceramic substrate 300 and the PCB substrate 400.

The connection pin 800 that has been installed to penetrate the through hole 320 of the upper ceramic substrate 300 and the through hole 420 of the PCB substrate 400 removes various output losses by connecting an electrode pattern a, b, c of the upper ceramic substrate 300 and the electrode pattern d of the PCB substrate 400 at the shortest distance, and facilitates control of great power at high speed by lowering impedance and inductance.

If impedance is low on the assumption that a voltage is constant, it is easy to control a current at high speed because a movement of the current is easy. Furthermore, if inductance is high, it is important to lower inductance for high-speed switching and heat dissipation because resistance is increased and heat is increased. Impedance and inductance are increased as a connection distance electrode patterns is increased.

If the lower ceramic substrate 200, the upper ceramic substrate 300, and the PCB substrate 400 are separately fabricated and are assembled and used if necessary, it is difficult to connect the electrode patterns at the shortest distance, various output losses occur because the electrode patterns need to be connected by using a wire, and there exist limitations in that it is difficult to control a current at high speed due to high impedance and inductance.

Accordingly, the power module of the embodiment minimizes a current path and lowers impedance and inductance by constructing a high output power semiconductor chip module and a drive printed circuit board assembly (PCBA) in an integrated type. The high output power semiconductor chip module means a module having a structure in which the high-output semiconductor chip G is disposed between the lower ceramic substrate 200 and the upper ceramic substrate 300. The drive PCBA means a PCB assembly in which a driving element, an electrode pattern, etc. are included in the PCB substrate 400.

The semiconductor chip G may be any one of an SiC chip, a GaN chip, an MOSFET, an IGBT, a JFET, and an HEMT. Preferably, the semiconductor chip G is a GaN chip, and is fixed to the lower surface of the upper ceramic substrate 300 in a flip chip form. In an embodiment, a surface electrode on the upper surface of the semiconductor chip G is bonded to the metal layer 303 of the lower surface of the upper ceramic substrate 300, and the lower surface of the semiconductor chip G is bonded to the metal layer 202 on the upper surface of the lower ceramic substrate 200. If the semiconductor chip G is fixed to the upper ceramic substrate 300 in the flip chip form as described above, the semiconductor chip G may have the best performance because the distance between the semiconductor chip G and a gate drive IC terminal can be designed as short as possible.

The connection pin 800 may connect a gate terminal of the semiconductor chip G mounted on the upper ceramic substrate 300 and a drive IC mounted on the PCB substrate 400. The drive IC includes a high gate drive IC (HS gate drive IC) and a low gate drive IC (LS gate drive IC). Furthermore, the connection pin 800 may connect the electrode pattern of the upper ceramic substrate 300 to a capacitor that is mounted on the PCB substrate 400.

The connection pin 800 perpendicularly connects the upper ceramic substrate 300 and the PCB substrate 400, but does not come into contact with the lower ceramic substrate 200 disposed under the upper ceramic substrate 300 in order to prevent a short.

The connection pins 800 formed in the through holes 320 and 420 in a way to penetrate through the through holes may be bonded to the electrode patterns a, b, and c at edges of the through holes 320 of the upper ceramic substrate 300 by laser welding. If the connection pin 800 is fit and coupled to the through hole 320 and bonded thereto by laser welding, it is easy to fix the connection pin 800 to the upper ceramic substrate 300, and the precision of a location is improved. This is advantageous in securing operation reliability of the power module because the connection pins 800 are stably connected to the electrode patterns a, b, and c of the upper ceramic substrate 300.

A solder layer 850 for bonding the connection pins 800 to the electrode patterns a, b, and c of the upper ceramic substrate 300 upon laser welding may be included. The solder layer 850 is coated on the edge of the through hole 320 of the upper ceramic substrate 300, and may be melted upon laser welding and connect the connection pins 800 to the electrode patterns a, b, and c. The connection pin 800 may be formed of copper or a copper alloy having conductivity. The connection pin 800 may be formed in a cylindrical shape corresponding to the diameter of the through hole 320, 420, and may be formed in a square pillar shape for the ease of production. Alternatively, the connection pin 800 may be manufactured in a bundle form, and may be fit and coupled to the through hole 320 of the upper ceramic substrate 300.

The diameter of the through hole 320, 420 may be 0.5 mm to 5.0 mm. When the diameter of the through hole 320, 420 is less than 0.5 mm, it may be difficult to fit and couple the connection pin 800, laser welding may be difficult, and stable fixing may be difficult. When the diameter of the through hole 320, 420 is greater than 5.0 mm, it becomes an obstacle to a reduction in the size of the power module 10 because the size of the power module 10 needs to be increased due to interference between adjacent electrode patterns.

The heat sink 500 attached to the lower surface of the lower ceramic substrate 200 is included. The heat sink 500 may be soldering-bonded to the lower surface of the lower ceramic substrate 200.

The lower ceramic substrate 200 and the upper ceramic substrate 300 include the metal layers 202 and 203, and 302 and 303 that are brazing-bonded to the upper and lower surfaces of the ceramic bases 201 and 301 and the ceramic bases 201 and 301. The ceramic bases 201 and 301 are formed of any one of alumina (Al$_2$O$_3$), ZTA, AlN, SiN, and Si$_3$N$_4$, and the metal layers 202 and 203, and 302 and 303 are formed of copper or a copper alloy material.

An example which the lower ceramic substrate 200 is an active metal brazing (AMB) substrate, the thickness of the ceramic base 201 that forms the AMB substrate is 0.635 mm, and the thickness of each of the metal layers 202 and 203 on the upper and lower parts of the ceramic base 201 is 0.8 mm may be taken.

An example in which the upper ceramic substrate 300 is an active metal brazing (AMB) substrate, the thickness of the ceramic base 301 that forms the AMB substrate is 0.38 mm, and the thickness of each of the metal layers 302 and 303 on the upper and lower parts of the ceramic base 301 is 0.3 mm may be taken. Furthermore, the metal layer is a copper foil, for example. The metal layers 302 and 303 form the electrode patterns a, b, and c.

An example in which the PCB substrate 400 is an FR4 substrate having a multi-layer structure and the thickness thereof is 0.9 mm may be taken. An example in which the heat sink 500 is formed any one of a copper material, a copper alloy material, a Cu—Mo—Cu three-layer structure, and a Cu—CuMo—Cu three-layer structure and the thickness thereof is 4 mm may be taken.

The via hole 330 may be formed in the upper ceramic substrate 300.

FIG. 12 is a perspective view illustrating a form in which via holes have been formed in the ceramic base of the upper ceramic substrate as an embodiment of the present disclosure. FIG. 13 is a perspective view illustrating a form in which via holes have been formed in the upper ceramic substrate as a modified example of FIG. 12 of the present disclosure.

As illustrated in FIG. 12, the via hole 330 is formed to penetrate the upper ceramic substrate 300 up and down. A metal filler P may be filled in the via hole 330, and may connect the electrode patterns a, b, and c on the upper surface and lower surface of the ceramic base 301.

Alternatively, as illustrated in FIG. 13, the via hole 330 is formed to penetrate the ceramic base 301 of an upper ceramic substrate 300'. The via hole 330 is formed in a plural number, and the via holes 330 are filled with the metal filler P. The metal filler P filled into the via hole 330 perpendicularly connects the electrode patterns a, b, and c on the upper surface and lower surface of the ceramic base 301. The metal filler P filled into the via hole 330 may protrude the upper and lower parts of the via hole 330, and may be bonded to the electrode patterns a, b, and c on the upper surface and lower surface of the ceramic base 301.

The ceramic base 301 of the upper ceramic substrate 300, 300' may be formed of any one of alumina (Al$_2$O$_3$), ZTA, AlN, SiN, and Si$_3$N$_4$. The metal layers 302 and 303 are formed of copper or a copper alloy material. The metal layers 302 and 303 of the upper ceramic substrate 300, 300' form the electrode patterns a, b, and c.

The ceramic base 301 has a structure in which an electrical connection between the electrode patterns a, b, and c on the upper and lower surfaces of the ceramic base 301 is impossible because the ceramic base 301 is formed of an insulating material as described above. The power module requires a loop connection and an electrical circuit connection through the semiconductor chip. If the length of an electrical loop is increased, an inductance value is increased. If the inductance value is increased, it is disadvantageous to a high-speed movement of a current.

Accordingly, in order to make the inductance value advantageous to the high-speed movement of the current by lowering the inductance value, moving efficiency of the current can be improved and the size of the power module can be reduced by connecting the electrode patterns a, b, and c on the upper surface and lower surface of the ceramic base 301 by the metal filler P filled into the via holes 330.

The diameter of the via hole 330 is in the range of 0.05 mm to 0.3 mm in order to facilitate the filling of the metal filler P. The metal filler P is made of conductive metal. For example, the metal filler P is made of one of Ag alloy series, Ag—Pd series, Ag-ceramic series, and Cu alloy series or a mixed paste of them. The metal filler P has low resistance, and improves moving efficiency of a current by connecting the electrode patterns a, b, and c on the upper surface and lower surface of the ceramic base 301.

Preferably, the diameter of the via hole 330 is in the range of 0.1 mm to 0.3 mm. In the range in which the diameter of the via hole 330 is 0.1 mm to 0.3 mm, the metal filler P may be filled into the via hole 330, and an excellent current-carrying property can be obtained. If the diameter of the via hole 330 is less than 0.05 mm, it is difficult for a current to pass through the electrode patterns a, b, and c on the upper surface and lower surface of the ceramic base 301 because it is difficult to fill the via hole 330 with the metal filler P. The via hole 330 may be formed to penetrate the upper ceramic substrate 300. If the diameter of the via hole 330 is greater than 0.3 mm, a problem in that the metal filler P comes out from the via hole 330 after sintering may occur.

The area of the via hole 330 may be 10% or more compared to the area of the upper ceramic substrate 300. The area of the via hole 330 is a minimum area for increasing moving efficiency of a current by connecting the electrode patterns a, b, and c on the upper surface and lower surface of the ceramic base 301. If the area of the via hole 330 is less than 10% compared to the area of an upper ceramic substrate 300", a problem may occur in the high-speed movement of a current because a moving load of the current is increased. Furthermore, it is preferred that the via hole 330 is uniformly distributed on the entire surface of the upper ceramic substrate 300, 300' for the distribution of a high current.

The aforementioned embodiment can easily control great power at high speed by minimizing a current path and lowering impedance and inductance in a way to fabricate the lower ceramic substrate 200, the upper ceramic substrate 300, and the PCB substrate 400 as a three-layer integration type.

Furthermore, the plurality of via holes 330 is formed in the upper ceramic substrate 300, 300' and connects the electrode patterns a, b, and c of the upper and lower surfaces of the upper ceramic substrate. Accordingly, a problem, such as a short or overheating, can be prevented and moving efficiency of a high-speed current can be improved because the distribution of a high current and the current-carrying of a high current are facilitated.

FIG. 14 is an internal construction diagram for describing a power module structure according to an embodiment of the present disclosure, and is a diagram that further includes a housing.

As illustrated in FIG. 14, the power module 10 is fabricated in a module form in which the lower ceramic substrate 200 is bonded to the upper surface of the heat sink 500, the upper ceramic substrate 300 is disposed over the lower ceramic substrate 200 in a way to be spaced apart from the lower ceramic substrate 200 through the medium of the insulating spacers 220, the PCB substrate 400 is disposed over the upper ceramic substrate 300 in a way to be spaced apart from the upper ceramic substrate 300 through the medium of the connection pins 800, and the lower ceramic substrate 200, the upper ceramic substrate 300, and the PCB substrate 400 are packaged by the housing 100.

The housing 100 is formed of an injection material, and has an empty space that is formed at the center thereof and that is opened up and down. The heat sink 500 is bonded to the lower surface of the housing 100. The lower ceramic substrate 200 is bonded to the upper surface of the heat sink 500 exposed to the empty space of the housing 100. The upper ceramic substrate 300 and the PCB substrate 400 are sequentially installed over the lower ceramic substrate 200. An isolation distance between the upper ceramic substrate 300 and the PCB substrate 400 is maintained to at least 0.5 mm in order to prevent damage to an element within the PCB substrate.

Furthermore, a silicon fluid S or epoxy is filled between the lower ceramic substrate 200 and the upper ceramic substrate 300. The silicon fluid S or epoxy insulates the electrode patterns of the lower ceramic substrate 200 and the upper ceramic substrate 300.

The power module 10 has a duplex structure of the lower ceramic substrate 200 and the upper ceramic substrate 300. The semiconductor chip G is mounted between the lower ceramic substrate 200 and the upper ceramic substrate 300 in order to protect the semiconductor chip G. The power module 10 has a duplex structure in which the PCB substrate 400 is disposed over the upper ceramic substrate 300, and has a packaging form using the silicon fluid S or epoxy. Accordingly, performance of the power module 10 can be implemented while not being limited to the area and volume thereof.

Furthermore, the power module 10 can remove various output losses and reduce its size because the electrode patterns of the upper ceramic substrate 300 and the PCB substrate 400 may be connected by fitting and coupling the connection pins 800 to the through holes 320 and 420 formed in the upper ceramic substrate 300 and the PCB substrate 400.

Furthermore, the power module 10 can prevent a problem, such as a short or overheating, and improve moving efficiency of a high-speed current because the distribution of a high current and the current-carrying of a high current are facilitated by forming the via holes 330 in the upper ceramic substrate 300, 300' and filling the via holes 330 with the metal filler P.

As described above, the aforementioned embodiment has advantages in that it can improve moving efficiency of a high-speed current by removing various output losses through electrical connections through the through holes and the via holes and can be reduced in size by improving restrictions to the size of the power module.

Meanwhile, as another embodiment, the power module can secure long lifespan and also improve reliability of the power module by forming a curvature inclined part at an edge of the ceramic substrate in order to reduce a stress concentration.

FIG. 15 is an internal construction diagram for describing a power module structure according to another embodiment of the present disclosure. FIG. 16 is a cross-sectional view illustrating the upper ceramic substrate in the power module structure according to another embodiment of the present disclosure.

A power module 10' of another embodiment is different from the embodiment in a shape of the upper ceramic substrate.

As illustrated in FIGS. 15 and 16, in the ceramic substrate 300" of another embodiment, a curvature inclined part 350, 350', 350" for reducing a stress concentration is formed at an edge of the metal layer 302", 303". The lifespan of the ceramic substrate may be determined by a material of the ceramic base and a shape of the metal layer 302", 303" that forms the electrode pattern.

The material of the ceramic base 301 is formed of any one of alumina ($Al_2O_3$), AlN, SiN, and $Si_3N_4$ having high strength in order to increase the lifespan of the ceramic base. As the thickness of the edge of the metal layer 302", 303" increases, bonding stress with the ceramic base 301 attributable to a stress concentration is increased. When the bonding stress is increased, the metal layer 302", 303" may be separated from the ceramic base 301 due to a sudden temperature change.

In order for the metal layer 302", 303" to be prevented from being separated from the ceramic base 301, the bonding stress needs to be minimized while maintaining the bonding strength. Accordingly, the curvature inclined part 350, 350', 350" that is rounded is formed at the edge of the metal layer 302", 303" in order to reduce a stress concentration by gradually reducing the thickness of the edge of the metal layer 302", 303".

The curvature inclined part 350, 350', 350" may include a shape that protrudes to the direction of the outer circumference of the ceramic base 301. For example, the curvature inclined part 350, 350', 350" is formed in a concave shape in the direction of the ceramic base, and the length of the protrusion of the curvature inclined part is increased toward the direction of the ceramic base. Alternatively, the curvature inclined part 350', 350" may have a multi-stage structure in which a plurality of concave parts 351, 352, 351', 352' is formed and a protruded part 353, 353' is formed at a part at which the concave part 351, 352 and the concave part 351', 352' are met. The protruded part 353, 353' has a pointed shape.

Alternatively, the curvature inclined part 350', 350" may have a two-stage structure in which two concave parts 351, 352, 351', 352' are formed and the protruded part 353, 353' is formed at a part at which the concave part 351, 352 and the concave part 351', 352' are met.

A one-stage structure and the multi-stage structure may be mixed in the curvature inclined part 350, 350', 350" formed at the edge of the metal layer 302", 303". For example, the curvature inclined part 350 having the one-stage structure may be formed at the edge of the metal layer 302", 303" on one side thereof, among the edges of the metal layers 302" and 303". The curvature inclined part 350', 350" having the multi-stage structure may be formed at the edge of the metal layer 302", 303" on the other thereof, among the edges of the metal layers 302" and 303". Alternatively, all of the curvature inclined part 350', 350" may be formed as the multi-stage structure along the edge of the metal layer 302", 303".

The length of the curvature inclined part 350 having the one-stage structure is formed to be relatively small compared to the thickness of the metal layer 302", 303" in order to strongly maintain the bonding strength while having a stress reduction function.

The curvature inclined part 350 having the one-stage structure can maintain the bonding strength although an interval between the metal layers 302" and 303" is narrow because an area where the metal layers 302" and 303" are bonded to the ceramic base 301 in the curvature inclined part 350 having the one-stage structure is relatively narrower than that in the curvature inclined part 350', 350" having the multi-stage structure.

The curvature inclined part 350', 350" having the multistage structure can strongly maintain the bonding strength because an area where the metal layers 302" and 303" are bonded to the ceramic base 301 in the curvature inclined part 350', 350" having the multi-stage structure is relatively wider than that in the curvature inclined part 350 having the one-stage structure. Instead, since an area where the curvature inclined part 350', 350" protrudes to the direction of the outer circumference of the ceramic base 301 is wide, it may be difficult to apply the curvature inclined part 350', 350" if an interval between the metal layers 302" and 303" that neighbor each other is narrow.

The metal layers 302" and 303" may include a curvature inclined part 350', 350" having a different shape on the outer circumference thereof that neighbors another metal layers 302" and 303" depending on an interval between the metal layers 302" and 303" and the another metal layers 302" and 303" adjacent to the metal layers 302" and 303".

The curvature inclined part 350, 350', 350" reduces a thermal and electrical shock by preventing a stress concentration at the edges of the metal layers 302" and 303". Accordingly, long lifespan that is 2 to 3 times or more of the ceramic substrate 300" is secured, and reliability is secured.

The ceramic substrate 300" illustrated in FIG. 16 is the upper ceramic substrate on which the semiconductor chip is mounted. In another embodiment, a case in which the curvature inclined part 350, 350', 350" is applied to the edge of the upper ceramic substrate 300" has been described as an example, but the curvature inclined part 350, 350', 350" may also be applied to the lower ceramic substrate.

The ceramic substrate 300" is any one of an active metal brazing (AMB) substrate, a direct bonding copper (DBC) substrate, a direct brazed aluminum (DBA) substrate, and a thick printing copper (TPC) substrate. A case in which the ceramic substrate 300" is the upper ceramic substrate 300" on which the semiconductor chip G is mounted has been described as an example.

FIGS. 17 and 18 are process flows for describing a method of manufacturing the upper ceramic substrate according to another embodiment of the present disclosure.

As illustrated in FIG. 17, the curvature inclined part 350, 350', 350" is formed by disposing a photomask m on one surface of the metal layer 302", 303" and etching the metal layer 302", 303" exposed by the photomask m.

Furthermore, the curvature inclined part 350', 350" having the multi-stage structure is formed by disposing a photomask m in which two or more holes have been adjacently formed on one surface of the metal layer 302", 303" and etching the metal layer 302", 303" exposed by the photomask m. If the photomask m in which two or more holes have been adjacently formed at a regular interval is used, the curvature inclined part 350', 350" having the multi-stage structure can be formed through one etching.

A process thereof may include step S10 of preparing the ceramic substrate, step S20 of forming the photomask, step S30 of forming the curvature inclined part, and step S40 of removing the photomask.

In step S10 of preparing the ceramic substrate, the ceramic substrate 300, including the ceramic base 301 and the metal layers 302" and 303" that have been brazing-bonded to at least one surface of the ceramic base 301 is prepared. The ceramic substrate 300 may be prepared in which the thickness of the ceramic base 301 is 0.3 mm to 0.4 mm and the thickness of the metal layer 302", 303" is 0.3.

In step S20 of forming the photomask, the photomask m in which two or more holes h have been adjacently formed on one surface of the metal layer 302", 303" may be formed.

Two or more holes h that have been adjacently formed are for forming the curvature inclined part 350', 350" having the multi-stage structure.

Furthermore, a plurality of photomasks m having an area narrower than that of the metal layer 302", 303" may be formed.

In step S30 of forming the curvature inclined part, the multi-stage curvature inclined part 350', 350" that includes the curvature inclined part 350' having an inclination rounded in the direction of the outer circumference of the ceramic base 301 toward the lower part of the metal layer 302", 303" or two or more rounded concave parts 351, 352, 351', 352' are formed by etching the metal layer 302", 303" exposed by the photomask m by using an etchant. Ferric chloride may be used as the etchant.

When the etchant is introduced into the two adjacent holes h, etching of about 80% is performed, and the curvature inclined part 350', 350" having the two-stage structure a degree of etching of which is different may be formed by one etching. In the two-stage structure, a shape and length of the concave part may be adjusted based on the size of an adjacent hole and an interval between the holes.

Furthermore, the shape and length of the concave part may be adjusted by adjusting a concentration and etching time of the etchant.

In step S40 of removing the photomask, after the curvature inclined part 350, 350', 350" is formed in the metal layer 302", 303", the photomask m formed on one surface of the metal layer 302", 303" is etched through an etchant. When the photomask m is removed by etching, the ceramic substrate 300" having a final state is fabricated. The ceramic substrate 300" is used as the upper ceramic substrate, and can increase the lifespan of the substrate by preventing a stress concentration at an edge thereof.

In the ceramic substrate 300" illustrated in FIG. 17, the curvature inclined part 350, 350', 350" in which the one-stage structure and the multi-stage structure have been mixed has been illustrated for convenience of description. However, only the curvature inclined part 350 having the one-stage structure may be formed at the edge of the ceramic substrate 300", or only the curvature inclined part 350', 350" having the two-stage structure may be formed at the edge of the ceramic substrate 300".

For example, as illustrated in FIG. 18, the curvature inclined part 350" having the multi-stage structure may be formed at the edge of the metal layer 302'.

The ceramic substrate 300" fabricated by using the aforementioned method contributes to securing long lifespan and increasing reliability of the power module by being applied to the power module, because a stress concentration attributable to heat and a stress concentration attributable to an electrical shock are reduced at the edge of the ceramic substrate, compared to the upper ceramic substrate 300 of the embodiment.

Optimum embodiments of the present disclosure have been disclosed in the drawings and specification. Specific terms have been used in the present specification, but the terms are used to only describe the present disclosure, not to limit the meaning of the terms or the scope of right of the present disclosure written in the claims. Accordingly, a person having ordinary knowledge in the art will understand that various modifications and other equivalent embodiments are possible from the embodiments. Accordingly, the true technical range of right of the present disclosure should be determined by the claims below.

The invention claimed is:

1. A power module comprising:

a lower ceramic substrate;

an upper ceramic substrate disposed over the lower ceramic substrate and configured to have a semiconductor chip mounted in a flip chip form on a lower surface of the upper ceramic substrate;

a PCB substrate disposed over the upper ceramic substrate;

a plurality of through holes formed to correspond to the upper ceramic substrate and the PCB substrate; and a connection pin formed in the through hole of the upper ceramic substrate and the through hole of the PCB substrate in a way to penetrate through the through holes and configured to perpendicularly connect an electrode pattern of the upper ceramic substrate and an electrode pattern of the PCB substrate;

wherein the connection pin formed in the through hole in a way to penetrate through the through holes is bonded to the electrode pattern of the upper ceramic substrate at an edge of the through hole by laser welding, further comprising a solder layer coated on the electrode pattern at the edge of the through hole of the upper ceramic substrate, melted upon the laser welding, and configured to bond the connection pin to the electrode pattern at the edge of the through hole of the upper ceramic substrate.

2. The power module of claim 1, wherein the upper ceramic substrate comprises:

a ceramic base;

electrode patterns formed on upper and lower surfaces of the ceramic base;

a plurality of via holes formed to penetrate the upper ceramic substrate or the ceramic base up and down; and a metal filler filled into the via hole and configured to connect the electrode patterns of the upper and lower surfaces of the ceramic base.

3. The power module of claim 2, wherein the via hole has a diameter of 0.05 mm to 0.3 mm.

4. The power module of claim 2, wherein the metal filler is made of one of Ag alloy series, Ag—Pd series, Ag-ceramic series, and Cu alloy series, or a mixed paste of them.

5. The power module of claim 2, wherein the via hole is uniformly distributed on an entire surface of the upper ceramic substrate or the ceramic base.

6. The power module of claim 1, further comprising a heat sink soldering-bonded to a lower surface of the lower ceramic substrate.

7. The power module of claim 1, wherein each of the upper ceramic substrate and the lower ceramic substrate is one of an active metal brazing (AMB) substrate, a direct bonding copper (DBC) substrate, a direct brazed aluminum (DBA) substrate, and a thick printing copper (TPC) substrate.

8. The power module of claim 1, further comprising a housing configured to have an empty space, opened up and down, formed at a center thereof and formed of an injection material, wherein the lower ceramic substrate, the upper ceramic substrate, and the PCB substrate are sequentially installed in the empty space of the housing.

9. The power module of claim 1, further comprising a spacer disposed between the lower ceramic substrate and the upper ceramic substrate in a plural number and configured to regulate an isolation distance between the lower ceramic substrate and the upper ceramic substrate.

10. The power module of claim 1, wherein:

the upper ceramic substrate comprises a ceramic base and a metal layer that forms an electrode pattern by being bonded to at least one surface of the ceramic base, a curvature inclined part is formed at an edge of the metal layer, and the curvature inclined part protrudes in a direction of an outer circumference of the ceramic base.

11. The power module of claim 10, wherein:

the curvature inclined part is formed in a concave shape in a direction of the ceramic base, and a protruded length of the curvature inclined part is increased toward the direction of the ceramic base.

12. The power module of claim 10, wherein the curvature inclined part has a multi-stage structure in which a plurality of concave parts is formed and a protruded part is formed at a part where the concave part and the concave part are met.

13. The power module of claim 12, wherein the protruded part has a pointed shape.

14. The power module of claim 10, wherein the curvature inclined part has a two-stage structure in which two concave parts are formed and a protruded part is formed at a part where the concave part and the concave part are met.

15. The power module of claim 10, wherein the curvature inclined part formed at the edge of the metal layer has a mixed structure of a one-stage structure formed in a concave shape in the direction of the ceramic base and a multi-stage structure in which two or more concave parts have been formed in the direction of the ceramic base.

16. The power module of claim 15, wherein the curvature inclined part is formed by disposing a photomask on one surface of the metal layer and etching the metal layer exposed by the photomask.

17. The power module of claim 15, wherein the curvature inclined part of the multi-stage structure is formed by disposing, on the one surface of the metal layer, a photomask in which two or more holes have been adjacently formed and etching the metal layer exposed by the photomask.

* * * * *